United States Patent
Shimizu

(10) Patent No.: US 9,824,741 B2
(45) Date of Patent: Nov. 21, 2017

(54) REFRESH CONTROL DEVICE, WIRELESS RECEIVER, AND SEMICONDUCTOR INTEGRATED CIRCUIT

(71) Applicant: Panasonic Corporation, Osaka (JP)

(72) Inventor: Shiro Shimizu, Osaka (JP)

(73) Assignee: PANASONIC INTELLECTUAL PROPERTY MANAGMENT CO., LTD., Osaka (JP)

( * ) Notice: Subject to any disclaimer, the term of this patent is extended or adjusted under 35 U.S.C. 154(b) by 267 days.

(21) Appl. No.: 13/803,304

(22) Filed: Mar. 14, 2013

(65) Prior Publication Data

US 2014/0281201 A1 Sep. 18, 2014

(51) Int. Cl.
*G11C 11/406* (2006.01)

(52) U.S. Cl.
CPC .. *G11C 11/40603* (2013.01); *G11C 11/40618* (2013.01); *G11C 11/40615* (2013.01)

(58) Field of Classification Search
CPC ............ G11C 11/406; G11C 11/40618; G11C 11/40615
See application file for complete search history.

(56) References Cited

U.S. PATENT DOCUMENTS

| | | | | |
|---|---|---|---|---|
| 4,625,296 A | * | 11/1986 | Shriver | ................. G11C 11/406 365/222 |
| 5,212,833 A | | 5/1993 | Suda et al. | |
| 5,808,952 A | * | 9/1998 | Fung et al. | .................... 365/222 |
| 2002/0136075 A1 | * | 9/2002 | Chen Hsu | ............. G11C 11/406 365/222 |
| 2006/0123188 A1 | * | 6/2006 | Obinata | ........................ 711/106 |
| 2009/0013127 A1 | * | 1/2009 | Atkinson | ....................... 711/106 |
| 2011/0131371 A1 | * | 6/2011 | Sun et al. | ..................... 711/106 |
| 2013/0080694 A1 | * | 3/2013 | Iyer et al. | ..................... 711/106 |

FOREIGN PATENT DOCUMENTS

| | | |
|---|---|---|
| JP | 62-042394 | 2/1987 |
| JP | 3-101317 | 4/1991 |
| JP | 7-40432 | 5/1995 |
| JP | 08-129883 | 5/1996 |
| JP | 2756739 | 5/1998 |
| JP | 11-219585 | 8/1999 |
| JP | 3122102 | 1/2001 |
| JP | 2007-048406 | 2/2007 |
| JP | 2012-098777 | 5/2012 |

* cited by examiner

*Primary Examiner* — Edward Dudek, Jr.
*Assistant Examiner* — Tian-Pong Chang
(74) *Attorney, Agent, or Firm* — Wenderoth, Lind & Ponack, L.L.P.

(57) ABSTRACT

Provided is a refresh control device including: an arbitration operating unit configured to arbitrate (i) a memory access request for accessing a volatile memory that requires a refresh operation for holding data and (ii) a refresh trigger for requesting execution of the refresh operation; and a trigger generating unit configured to generate refresh triggers in a non-constant cycle to satisfy refresh-rate requirements defining the number of refresh operations necessary to be executed per predetermined period for the volatile memory to hold the data.

18 Claims, 21 Drawing Sheets

REFRESH CONTROL DEVICE, WIRELESS RECEIVER, AND SEMICONDUCTOR INTEGRATED CIRCUIT

CROSS REFERENCE TO RELATED APPLICATION

The present application is related to Japanese Patent Application No. 2010-243492 filed on Oct. 29, 2010. The entire disclosure of the above-identified application, including the specification, drawings and claims is incorporated herein by reference in its entirety.

FIELD

One or more exemplary embodiments disclosed herein relate to a volatile memory that requires a refresh operation for holding data, and to a refresh control device, a wireless receiver, and a semiconductor integrated circuit each of which generates refresh triggers for requesting execution of the refresh operation.

BACKGROUND

In recent years, the number of functions of wireless receivers including radio tuners increases. In the product area of consumer-oriented audio devices and car audio devices, except for the radio tuners, the number of functions including a function for reproducing CDs and DVDs, a connection function to media, such as a USB memory and an SD memory card, and a vehicle-mounted navigation function increases more than ever before, and the lineup of products also increases. These increased functions are often implemented by semiconductor digital circuits that have been highly integrated.

In such a circumstance, there is a problem that harmonic components of various digital signals cause EMI noise and influences a radio frequency range. The EMI noise is sometimes propagated through GND lines or through the space with capacitive coupling and electromagnetic coupling to antenna input lines.

Against the EMI noise that interferes with reception of wireless signals, noise suppression parts such as capacitors and ferrite beads, and methods for avoiding noise by taking measures for circuits that are noise sources have been conventionally studied.

The representative example is described in Patent Literature (PTL) 1 that discloses a technique for spectrum spreading a clock signal of a digital circuit and reducing a peak value of a noise spectrum. Furthermore, PTL 2 describes a technique for shifting a clock frequency according to a reception frequency. These techniques are effective against noise.

On the other hand, digital processing on radio tuners is advancing, and tuner units are being integrated into system large scale integrations (LSIs) using complementary metal oxide semiconductor (CMOS) circuits.

Conventionally, a structure in which an iron plate encloses a small-scale pack module of an analog circuit is mainly used for blocking out external noise.

However, the integration of tuner units into system LSIs allows high-performance digital LSIs and wireless receiving units to be densely mounted on the same board. Thus, the problem of noise is further inextricable in reception of wireless signals.

Along with high speed and high integration, many digital processing circuits including LSIs that implement high functions require memories that have large capacity. Thus, many systems use Dynamic Random Access Memories (DRAMs). The systems are equipped with DRAMs that are near LSIs or included in the LSIs.

The DRAMs store information by accumulating electric charges in capacitors within memory cells. The DRAMs require a refresh operation for reading and rewriting the stored information at predetermined time intervals to hold the information stored in the memory cells.

General DRAMs have a mechanism for holding data by performing refresh access predetermined times in a predetermined period. Specifically, the refresh operation is performed by selecting word lines while the word lines are scanned in the DRAMs.

PTL 3 discloses a technique on a refresh operation to effectively use memories that require refresh. Specifically, a refresh request is performed at predetermined time intervals, and when an access request and a refresh request from a device that uses a memory overlap one another, in principle, processing for the access request is prioritized. In the process, when the number of unprocessed refresh requests reaches a predetermined value, the refresh operation is prioritized.

CITATION LIST

Patent Literature

[PTL 1] Japanese Patent No. 2756739
[PTL 2] Japanese Patent No. 3122102
[PTL 3] Japanese Examined Patent Application Publication No. 7-40432

SUMMARY

However, the conventional refresh control method has the following problem.

In the refresh operation of DRAMs, it is necessary to pre-charge internal data lines and set a threshold voltage (for determining a voltage to be 1 or 0) to a sense amplifier. Here, a large current flows during the pre-charging of the internal data lines, and EMI noise occurs due to power supply variation in power source lines and GND lines.

FIG. 19 is a block diagram illustrating a configuration of a general wireless receiver 5000.

With reference to FIG. 19, the wireless receiver 5000 includes a memory controller 10, a DRAM 20, an antenna 30, and a tuner unit 31, and a Central Processing Unit (CPU) 32.

The tuner unit 31 receives a wireless signal through the antenna 30. The CPU 32 controls the tuner unit 31 and the memory controller 10.

The memory controller 10 performs request for a refresh operation or memory access to the DRAM 20. Assume here that a memory access to the DRAM 20 is stopped, and the DRAM 20 performs a refresh operation.

FIG. 20 illustrates cycles of refresh requests generated in the memory controller 10 to perform memory access to the DRAM 20.

In FIG. 20, one refresh request corresponds to one trigger (pulse). In other words, the cycles of refresh requests are constant. Here, $T_{ref}$ denotes cycles of refresh requests as triggers (pulses). Furthermore, $T_{ref}=1/F_{ref}$ is satisfied. Here, a frequency spectrum of a signal with the cycle $T_{ref}$ is represented in FIG. 21.

The signal with the cycle $T_{ref}$ is a signal representing a fundamental at a frequency $F_{ref}$ and harmonics of an integral multiple of $F_{ref}$.

When the cycles of refresh requests as triggers (pulses) are constant, the level of noise caused by the refresh requests is high. Accordingly, the level of the EMI noise is also high.

Here, when the constituent elements of the wireless receiver 5000 are placed on a common board or in a semiconductor integrated circuit, the high EMI noise occurring in the DRAM 20 propagates to the tuner unit 31 through a common GND line and an aerial path. Thus, the reception quality of the tuner unit 31 is degraded.

In other words, when the cycles of triggers for requesting refresh operations of a memory are constant, a problem of a malfunction occurs due to high-level noise caused by the triggers. Examples of the malfunction include degradation in the reception quality of the tuner unit 31.

One non-limiting and exemplary embodiment provides a refresh control device and others that are capable of reducing the level of noise caused by the cycles of triggers for requesting refresh operations of a memory.

In order to solve the problems, the refresh control device according to an aspect of the present disclosure is a refresh control device including: an arbitration operating unit configured to arbitrate (i) a memory access request for accessing a volatile memory that requires a refresh operation for holding data and (ii) a refresh trigger for requesting execution of the refresh operation; and a trigger generating unit configured to generate refresh triggers in a non-constant cycle to satisfy refresh-rate requirements defining the number of refresh operations necessary to be executed per predetermined period for the volatile memory to hold the data.

Specifically, the refresh control device includes: an arbitration operating unit configured to arbitrate (i) a memory access request for accessing a volatile memory and (ii) a refresh trigger for requesting execution of the refresh operation; and a trigger generating unit configured to generate refresh triggers in a non-constant cycle to satisfy refresh-rate requirements.

In other words, the trigger generating unit generates refresh triggers in a non-constant cycle to satisfy the refresh-rate requirements.

For example, a level of noise occurring in a non-constant cycle is lower than a level of noise caused by the triggers generated in a constant cycle.

Thus, the refresh control device according to the aspect can satisfy the refresh-rate requirements, and reduce the level of noise caused by the cycles of triggers for requesting refresh operations of a memory more than the level of noise caused by the triggers generated in a constant cycle.

Furthermore, the arbitration operating unit may include: a refresh request unit configured to output a refresh request for requesting execution of the refresh operation, based on the refresh triggers generated by the trigger generating unit; and an arbitrating unit configured to arbitrate the memory access request and the refresh request output by the refresh request unit.

Furthermore, the trigger generating unit may include: a base cycle counter that sequentially indicates values from a first value to a second value larger than the first value, in a base cycle that satisfies the refresh-rate requirements, the base cycle counter being a counter that indicates a same value at each base cycle; a comparative value generating unit configured to output, at each of the base cycles, one of the values from the first value to the second value as a comparative value, the comparative value being a different value at each of the base cycles; and a matching detection unit configured to detect a matching timing at which the value indicated by the base cycle counter and the comparative value output by the comparative value generating unit match, and generate the refresh triggers at the matching timing.

Furthermore, the comparative value generating unit may include: a comparative value holding unit configured to hold the comparative value, and output the held comparative value; an addition unit configured to perform addition processing, at each of the base cycles, for adding an additional value to the comparative value held by the comparative value holding unit to calculate a first calculated value; and a limit processing unit configured to determine whether or not the first calculated value is larger than the second value, each time the addition unit performs the addition processing, the limit processing unit may be further configured to: perform limit processing for subtracting a difference between the first value and the second value from the first calculated value to calculate a second calculated value, and transmit the second calculated value to the comparative value holding unit as a latest comparative value, when the first calculated value is larger than the second value; and transmit the first calculated value to the comparative value holding unit as a latest comparative value, when the first calculated value is smaller than or equal to the second value, and the comparative value holding unit may be configured to hold the latest comparative value transmitted from the limit processing unit instead of the held comparative value, at each of the base cycles.

Furthermore, the comparative value generating unit may include: a comparative value holding unit configured to hold the comparative value, and output the held comparative value; an additional value holding unit configured to hold an additional value and output a held latest additional value, at each of the base cycles; an addition unit configured to perform addition processing for adding, at each of the base cycles, the latest additional value held by the additional value holding unit to the comparative value held by the comparative value holding unit to calculate a first calculated value; a first determining unit configured to determine whether or not the first calculated value is larger than the second value, each time the addition unit performs the addition processing; a second determining unit configured to determine whether or not the latest additional value output by the additional value holding unit is the first value or the second value; and a computing unit configured to perform computation using the additional value, each time the additional value holding unit outputs the latest additional value, the second determining unit may be further configured to: cause the computing unit to increment the additional value held by the additional value holding unit by 1 at each of the base cycles until the additional value becomes the second value and to transmit the latest additional value to the additional value holding unit each time the additional value is incremented by 1, when the additional value is the first value; and cause the computing unit to decrement the additional value held by the additional value holding unit by 1 at each of the base cycles until the additional value becomes the first value and to transmit the latest additional value to the additional value holding unit each time the additional value is decremented by 1, when the additional value is the second value, and the additional value holding unit may be configured to hold the latest additional value transmitted from the computing unit instead of the held additional value, at each of the base cycles.

Furthermore, the first determining unit may be further configured to: perform limit processing for subtracting a difference between the first value and the second value from the first calculated value to calculate a second calculated value, and transmit the second calculated value to the comparative value holding unit as a latest comparative value, when the first calculated value is larger than the second value; and transmit the first calculated value to the comparative value holding unit as a latest comparative value, when the first calculated value is smaller than or equal to the second value, and the comparative value holding unit may be configured to hold the latest comparative value transmitted from the first determining unit instead of the held comparative value, at each of the base cycles.

Furthermore, the trigger generating unit may include: a reference counter that sequentially indicates values from a first value to a third value larger than the first value, in a division cycle that is M or more times as large as a base cycle that satisfies the refresh-rate requirements, where M is an integer larger than or equal to 2, the reference counter indicating a same value at each division cycle; and M matching detection units each configured to hold one of the values from the first value to the third value as a comparative value, the M comparative values held by the M matching detection units may be different from each other, the M matching detection units may be configured to detect matching timings at each of which the value indicated by the reference counter and the comparative value held by the matching detection unit match, and generate triggers at the matching timings, and the trigger generating unit may further include a generating unit configured to generate, as the refresh triggers, the triggers generated by the M matching detection units at the matching timings that are different from each other.

Furthermore, the trigger generating unit may include: a variable cycle counter that counts only a variable cycle setting value for determining a timing at which the refresh trigger is generated, and generates a trigger each time the counting ends; and a cycle setting value generating unit configured to output a different value to the variable cycle counter as the cycle setting value to be counted by the variable cycle counter, each time the variable cycle counter generates the trigger, and the variable cycle counter may generate, as the refresh trigger, the trigger generated each time the counting ends.

Furthermore, the cycle setting value output by the cycle setting value generating unit may be one of values from a fourth value to a fifth value larger than the fourth value, the fourth value may be a value obtained by subtracting 1/u of a predetermined value from the predetermined value, where u is an integer larger than or equal to 2, the predetermined value corresponding to a base cycle that satisfies the refresh-rate requirements, the fifth value may be a value obtained by adding the 1/u of the predetermined value to the predetermined value, the cycle setting value generating unit may include: a cycle setting value holding unit configured to hold the cycle setting value, and output a held latest cycle setting value at least to the variable cycle counter, each time the variable cycle counter generates the trigger; a determining unit configured to determine whether or not the latest cycle setting value output by the cycle setting value holding unit is the fourth value or the fifth value; and a computing unit configured to perform computation using the cycle setting value, each time the cycle setting value holding unit outputs the latest cycle setting value, the determining unit may be further configured to: cause the computing unit to increment the cycle setting value held by the cycle setting value holding unit by 1 until the cycle setting value becomes the fifth value and to transmit the latest cycle setting value to the cycle setting value holding unit each time the cycle setting value is incremented by 1, when the cycle setting value is the fourth value; and cause the computing unit to decrement the cycle setting value held by the cycle setting value holding unit by 1 until the cycle setting value becomes the fourth value and to transmit the latest cycle setting value to the cycle setting value holding unit each time the cycle setting value is decremented by 1, when the cycle setting value is the fifth value, and the cycle setting value holding unit may be configured to hold the latest cycle setting value transmitted from the computing unit instead of the held cycle setting value, each time the variable cycle counter generates the trigger.

Furthermore, the cycle setting value generating unit may include a code generating unit configured to output an M-sequence cyclic code of a different value to the variable cycle counter as the cycle setting value to be counted by the variable cycle counter, each time the variable cycle counter generates the trigger.

Furthermore, the refresh control device may have functions of generating the refresh triggers, both in a constant cycle and in a non-constant cycle.

The wireless receiver according to another aspect of the present disclosure is a wireless receiver including: the refresh control device; a tuner unit configured to receive a wireless signal; and the volatile memory for holding the data, wherein the refresh control device generates, in the non-constant cycle, the refresh triggers for requesting the volatile memory to perform the refresh operation.

Furthermore, a frequency at which the tuner unit receives the wireless signal may be different from each frequency indicated by a signal including the refresh triggers in the non-constant cycle.

Furthermore, the tuner unit, the volatile memory, and the refresh control device may be placed on a same board.

The semiconductor integrated circuit according to another aspect of the present disclosure is a semiconductor integrated circuit including: the refresh control device; and a tuner unit configured to receive a wireless signal.

According to the present disclosure, the refresh control device can reduce a level of noise caused by the cycles of triggers for requesting refresh operations of a memory.

BRIEF DESCRIPTION OF DRAWINGS

These and other objects, advantages and features of the invention will become apparent from the following description thereof taken in conjunction with the accompanying drawings that illustrate a specific embodiment of the present invention.

DETAILED DESCRIPTION OF INVENTION

Figure 1:
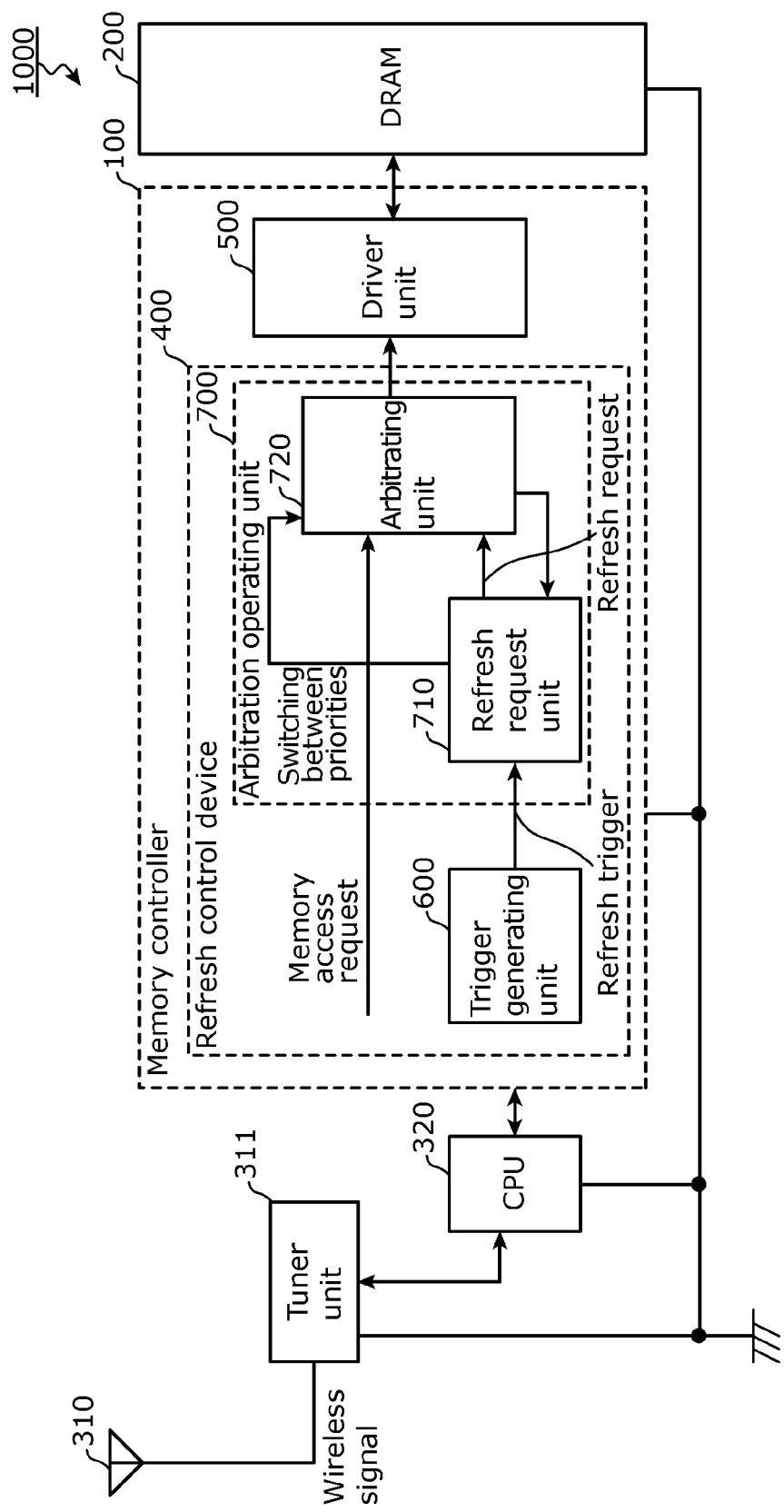
FIG. 1 is a block diagram illustrating a configuration of a wireless receiver according to Embodiment 1.

Embodiments of the present disclosure will be described with reference to the drawings. The same reference numerals are assigned the same constituent elements in the following description. The names and the functions are the same. Thus, the detailed description thereof is sometimes omitted.

A configuration in which an apparatus that generates refresh triggers for causing a volatile memory that requires a refresh operation to perform the refresh operation will be described. Here, the refresh trigger suppresses or prevents degradation in a reception state of a wireless receiver.

Embodiment 1

FIG. 1 is a block diagram illustrating a configuration of a wireless receiver 1000 according to Embodiment 1. The wireless receiver 1000 is, for example, a radio receiver. The wireless receiver 1000 is not limited to a radio receiver, and may be another device (for example, communication device) that receives a wireless signal.

With reference to FIG. 1, the wireless receiver 1000 includes a memory controller 100, a DRAM 200, an antenna 310, a tuner unit 311, and a CPU 320.

The tuner unit 311 receives a wireless signal through the antenna 310. The wireless signal is, for example, an amplitude modulation (AM) wave signal or a frequency modulation (FM) wave signal.

The CPU 320 controls the tuner unit 311 and the memory controller 100.

The DRAM 200 is a volatile memory that requires a refresh operation for holding data.

The memory controller 100 transmits, to the DRAM 200, a control signal for controlling the DRAM 200. The control signal is a signal for controlling access to the DRAM 200 or a signal for causing the DRAM 200 to perform a refresh operation.

The memory controller 100 includes a refresh control device 400 and a driver unit 500.

The refresh control device 400 transmits, to the driver unit 500, access signals based on various instructions from the constituent elements of the refresh control device 400.

The driver unit 500 outputs an address and inputs and outputs data, according to an access signal. Since processing performed by the driver unit 500 is the same as that performed by a driver of a general DRAM, the details are not described herein.

The refresh control device 400 includes a trigger generating unit 600 and an arbitration operating unit 700.

The trigger generating unit 600 generates refresh triggers for requesting execution of the refresh operation, which will be described in detail later.

The arbitration operating unit 700 conceptually arbitrates a refresh trigger and a memory access request for accessing the DRAM 200. Specifically, the arbitration operating unit 700 arbitrates a memory access request, and a refresh request based on the refresh trigger.

The arbitration operating unit 700 includes a refresh request unit 710 and an arbitrating unit 720.

Each time the refresh request unit 710 receives a refresh trigger, it increments (counts up) a value of a refresh request counter by 1. The refresh request counter is a counter indicating a reception state of a refresh trigger.

Each time the refresh request unit 710 receives a refresh trigger, it transmits (outputs) the refresh request to the arbitrating unit 720 as necessary. The refresh request is a request for requesting execution of the refresh operation.

In other words, the refresh request unit 710 outputs a refresh request based on the refresh trigger generated by the trigger generating unit 600.

The arbitrating unit 720 arbitrates a memory access request and a refresh request when they are competing with each other. As a result of the arbitration, the arbitrating unit 720 permits one of the memory access request and the refresh request, and transmits, to the driver unit 500, an access signal in accordance with the permission.

Upon receipt of the refresh request, the arbitrating unit 720 transmits, to the refresh request unit 710, a refresh request receipt signal indicating the receipt of the refresh request. Each time the refresh request unit 710 receives the refresh request receipt signal, it decrements (counts down) a value of the refresh request counter by 1.

Upon simultaneous receipt of a memory access request and a refresh request, the arbitrating unit 720 in principle prioritizes a process for the memory access request. The prioritization is based on an instruction for switching between the priorities from the refresh request unit 710.

In the process, when the number of unprocessed refresh operations corresponding to the refresh requests reaches a predetermined value, the refresh operations are prioritized.

When there is no memory access request, the arbitrating unit 720 accepts a refresh request at a maximum speed. On the other hand, during a period of memory access to the DRAM 200, the refresh request is in a wait state.

During a period of dedicated access to the DRAM 200 by a burst operation in response to the memory access request, the value of the refresh request counter is counted up. At the end of the memory access, the refresh operations corresponding to the value indicated by the refresh request counter are successively performed.

Figure 2:
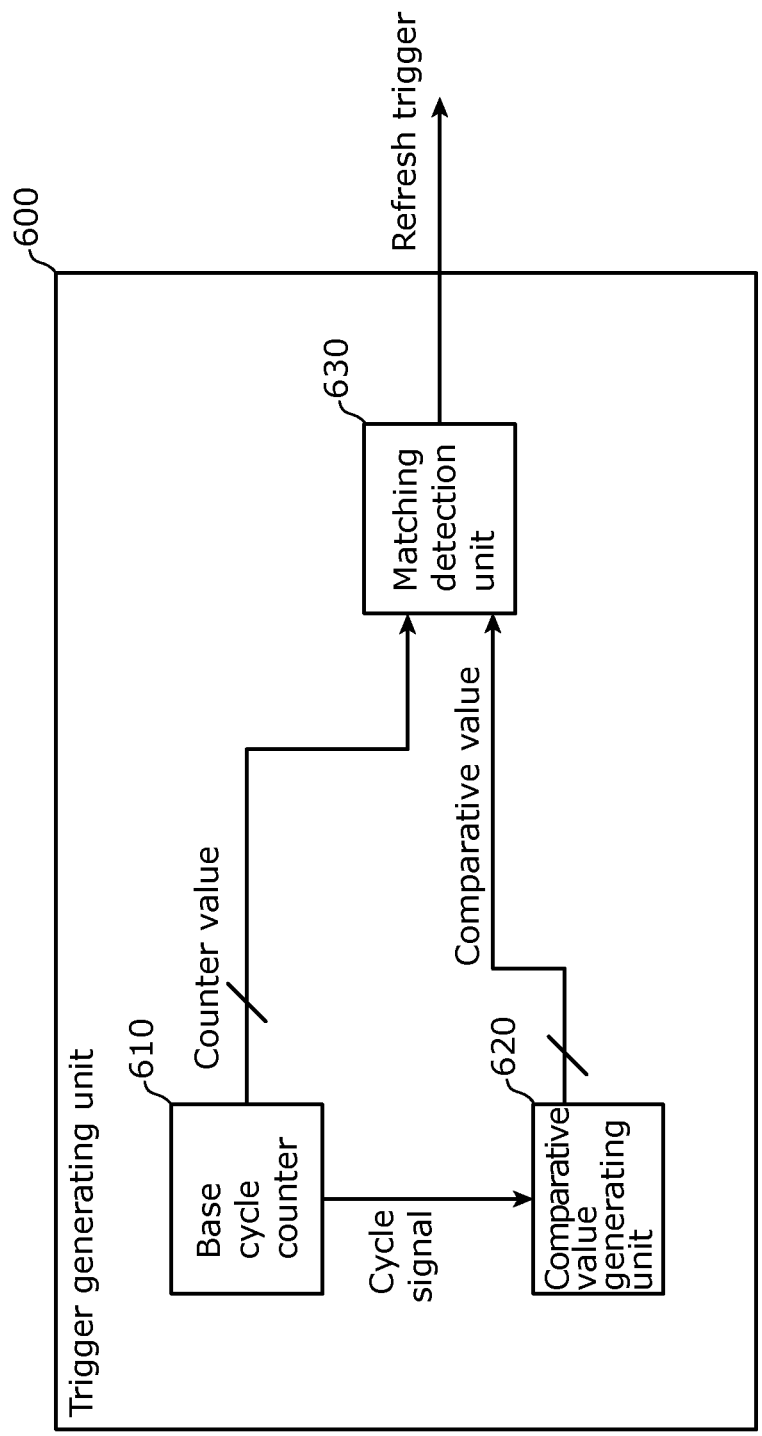
FIG. 2 is a block diagram illustrating a configuration of a trigger generating unit according to Embodiment 1.

FIG. 2 is a block diagram illustrating a configuration of the trigger generating unit 600 according to Embodiment 1.

With reference to FIG. 2, the trigger generating unit 600 includes a base cycle counter 610, a comparative value generating unit 620, and a matching detection unit 630.

The base cycle counter 610 is, for example, a counter sequentially indicating counter values from 0 to 15 in a base cycle that satisfies refresh-rate requirements. In other words, the base cycle counter 610 sequentially indicates (counts) the counter values from 0 to 15 in the base cycle.

Here, the refresh-rate requirements are requirements on refreshing of the DRAM 200. The refresh-rate requirements are requirements for the DRAM 200 to hold data, and are requirements in which the necessary number of refresh operations N per predetermined period t1 is defined. In other words, the necessary number of refresh operations N per predetermined period t1 is the necessary number of refresh operations per predetermined period for the DRAM 200 to hold data.

The base cycle that satisfies the refresh-rate requirements is represented by a value obtained by dividing the predetermined period t1 by the necessary number of refresh operations N and multiplying the result by the number to be counted in the base cycle.

For example, assume that the predetermined period t1 is 64 ms and the necessary number of refresh operations N is 4096. Here, the base cycle that satisfies the refresh-rate requirements is calculated by 64 m/4096×16. Furthermore, the refresh-rate requirements are requirements that indicate that 4096 refresh operations are necessary every 64 ms.

In other words, the base cycle counter 610 is a counter that sequentially indicates values from the first value (0) to the second value (15) larger than the first value in a base cycle that satisfies the refresh-rate requirements, and is a counter that indicates the same value at each base cycle.

The number of refresh operations per predetermined period varies according to a condition, such as the capacitance of a capacitor that holds electric charges within the DRAM 200 and a temperature. Assuming that a refresh operation is performed in a predetermined cycle, the refresh operation is necessary in a range from several tens of kHz to several MHz order.

Here, assume that the wireless receiver 1000 is a radio receiver, and a wireless signal received by the tuner unit 311 is an AM wave signal. Here, the wireless signal is in a frequency band of 530 to 1710 kHz.

Furthermore, assume that the wireless receiver 1000 is a radio receiver, and a wireless signal received by the tuner unit 311 is an FM wave signal. Here, the wireless signal is in a frequency band of 76 to 109 MHz.

Furthermore, each time the counter value indicated by the base cycle counter 610 changes, the base cycle counter 610 transmits the latest counter value to the matching detection unit 630. Accordingly, the matching detection unit 630 sequentially receives the counter values from 0 to 15 in a base cycle.

Furthermore, the base cycle counter 610 transmits a cycle signal to the comparative value generating unit 620 as a trigger (pulse), for example, at timing of "0" indicated by the base cycle counter 610. In other words, the base cycle counter 610 transmits the cycle signal to the comparative value generating unit 620 at each base cycle.

Each time the comparative value generating unit 620 receives the cycle signal, it transmits any different comparative values to the matching detection unit 630, which will be described in detail later. Here, the comparative value is a value to be compared with a counter value by the matching detection unit 630. The comparative value is one of the counter values indicated by the base cycle counter 610.

In other words, the comparative value generating unit 620 outputs one of values from the first value to the second value that is a different value at each base cycle, as a comparative value at each of the base cycles. Here, for example, the first value and the second value are "0" and "15", respectively.

The matching detection unit 630 detects a matching timing at which the counter value transmitted from the base cycle counter 610 and the latest comparative value output from the comparative value generating unit 620 match. Then, the matching detection unit 630 generates a trigger as a refresh trigger at the detected matching timing.

In other words, the matching detection unit 630 detects a matching timing at which the value indicated by the base cycle counter 610 and the latest comparative value output from the comparative value generating unit 620 match. Then, the matching detection unit 630 generates a refresh trigger at the detected matching timing.

In other words, the trigger generating unit 600 transmits a trigger to the refresh request unit 710 as a refresh trigger at timing at which the value indicated by the base cycle counter 610 and the comparative value output from the comparative value generating unit 620 match, at each base cycle.

Accordingly, the occurrence cycles of refresh requests satisfy the refresh-rate requirements, and cannot be constant. In other words, the trigger generating unit 600 generates refresh triggers in a non-constant cycle to satisfy the refresh-rate requirements. Here, the non-constant cycle is a cycle changing with time. The non-constant cycle will be also referred to as a variable cycle below.

Figure 3:
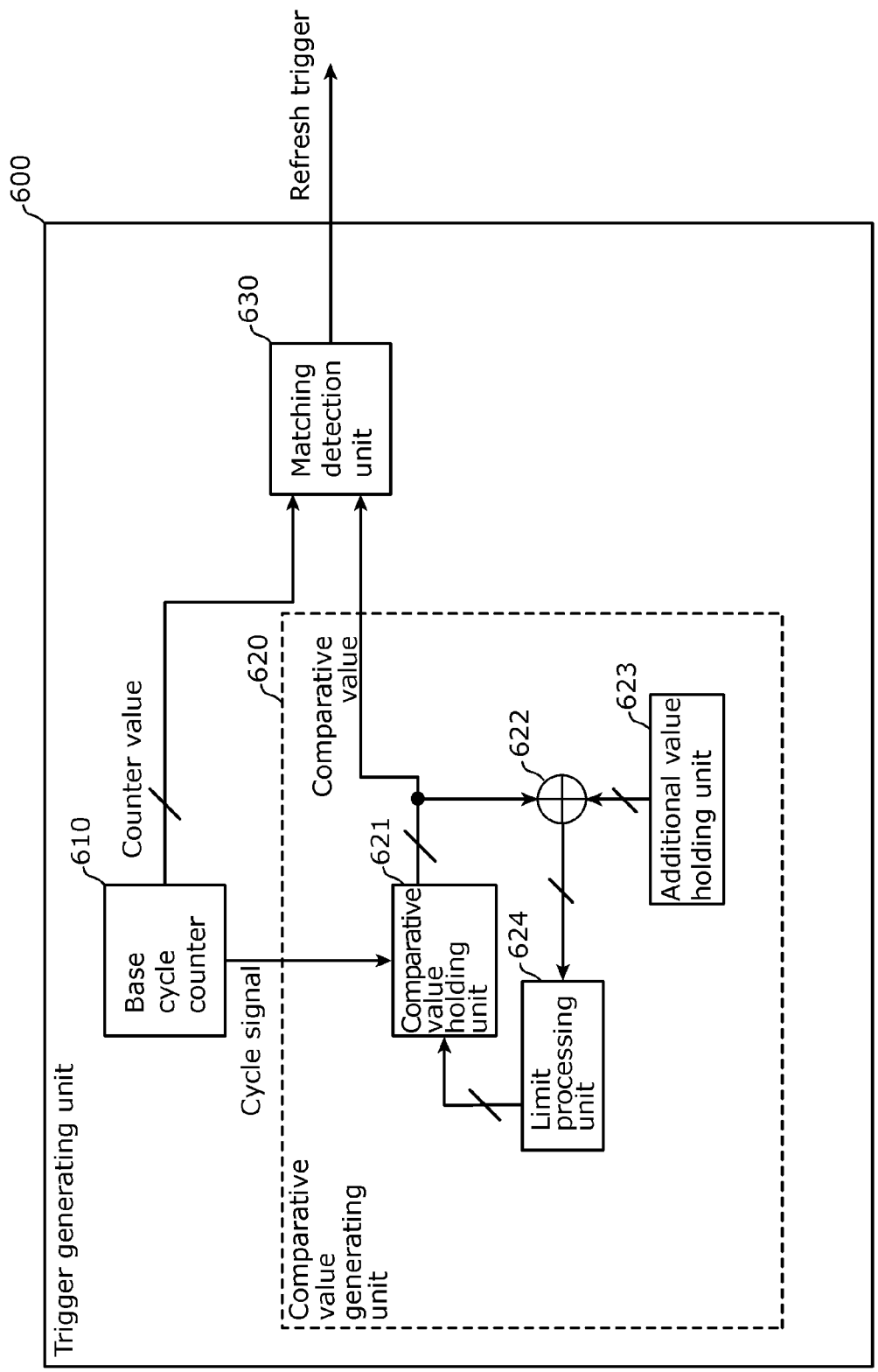
FIG. 3 is a block diagram illustrating a configuration of a comparative value generating unit according to Embodiment 1.

FIG. 3 is a block diagram illustrating a configuration of the comparative value generating unit 620 according to Embodiment 1.

With reference to FIG. 3, the comparative value generating unit 620 includes a comparative value holding unit 621, an addition unit 622, an additional value holding unit 623, and a limit processing unit 624.

The base cycle counter 610 transmits the cycle signal to the comparative value holding unit 621 at each base cycle.

The comparative value holding unit 621 holds one comparative value. Furthermore, the comparative value holding unit 621 continues to transmit the held comparative value to the matching detection unit 630 and the addition unit 622. In other words, the comparative value holding unit 621 holds the comparative value, and outputs the held comparative value.

Assume that the comparative value holding unit 621 holds "0" as an initial comparative value.

The additional value holding unit 623 holds an additional value set by an outside device to any value. The additional value held by the additional value holding unit 623 is set by, for example, the CPU 320. The additional value is a value smaller than the maximum value of the counter values indicated by the base cycle counter 610. The additional value is, for example, "7".

The additional value holding unit 623 continues to transmit the held additional value to the addition unit 622.

The addition unit 622 adds the additional value transmitted from the additional value holding unit 623 to the comparative value transmitted from the comparative value holding unit 621. The comparative value holding unit 621 updates a comparative value at each base cycle and transmits the updated comparative value to the matching detection unit 630 and the addition unit 622, which will be described in detail later.

In other words, the addition unit 622 adds the additional value to the comparative value held by the comparative value holding unit 621 at each base cycle.

The value calculated in the addition processing will be referred to as a first calculated value. Furthermore, the addition unit 622 transmits, to the limit processing unit 624, the first calculated value calculated in the addition processing, in every addition.

Each time the limit processing unit 624 receives the first calculated value, it determines whether or not the first calculated value is larger than the maximum value of the counter values. In other words, each time the addition unit 622 perform addition processing, the limit processing unit 624 determines whether or not the first calculated value calculated in the addition processing is larger than a second value (for example, "15" that is the maximum value of the counter values).

When the first calculated value is larger than the second value, the limit processing unit 624 further performs limit processing for subtracting a difference between the first value and the second value (the number of values) from the first calculated value. Here, the difference is a value obtained by (the maximum value of the counter values)+1. When the first value and the second value are "0" and "15", respectively, the difference (the number of values) is 16.

Then, the limit processing unit 624 continues to transmit the second calculated value calculated in the limit processing to the comparative value holding unit 621 as the latest comparative value.

Furthermore, when the first calculated value is larger than or equal to the second value, the limit processing unit 624 continues to transmit the first calculated value to the comparative value holding unit 621 as the latest comparative value.

Each time the comparative value holding unit 621 receives the cycle signal, it receives the latest comparative value from the limit processing unit 624, and holds the latest comparative value instead of the held comparative value. In other words, the comparative value holding unit 621 holds the latest comparative value transmitted from the limit processing unit 624 instead of the held comparative value at each base cycle.

Furthermore, the comparative value holding unit 621 continues to transmit the held latest comparative value to the matching detection unit 630 and the addition unit 622. In other words, the comparative value holding unit 621 updates a comparative value at each base cycle and transmits the updated comparative value to the matching detection unit 630 and the addition unit 622.

As described above, the matching detection unit 630 detects a matching timing, and generates a refresh trigger at the matching timing.

With the processes, the trigger generating unit 600 generates refresh triggers in a variable cycle to satisfy the refresh-rate requirements.

Figure 4:
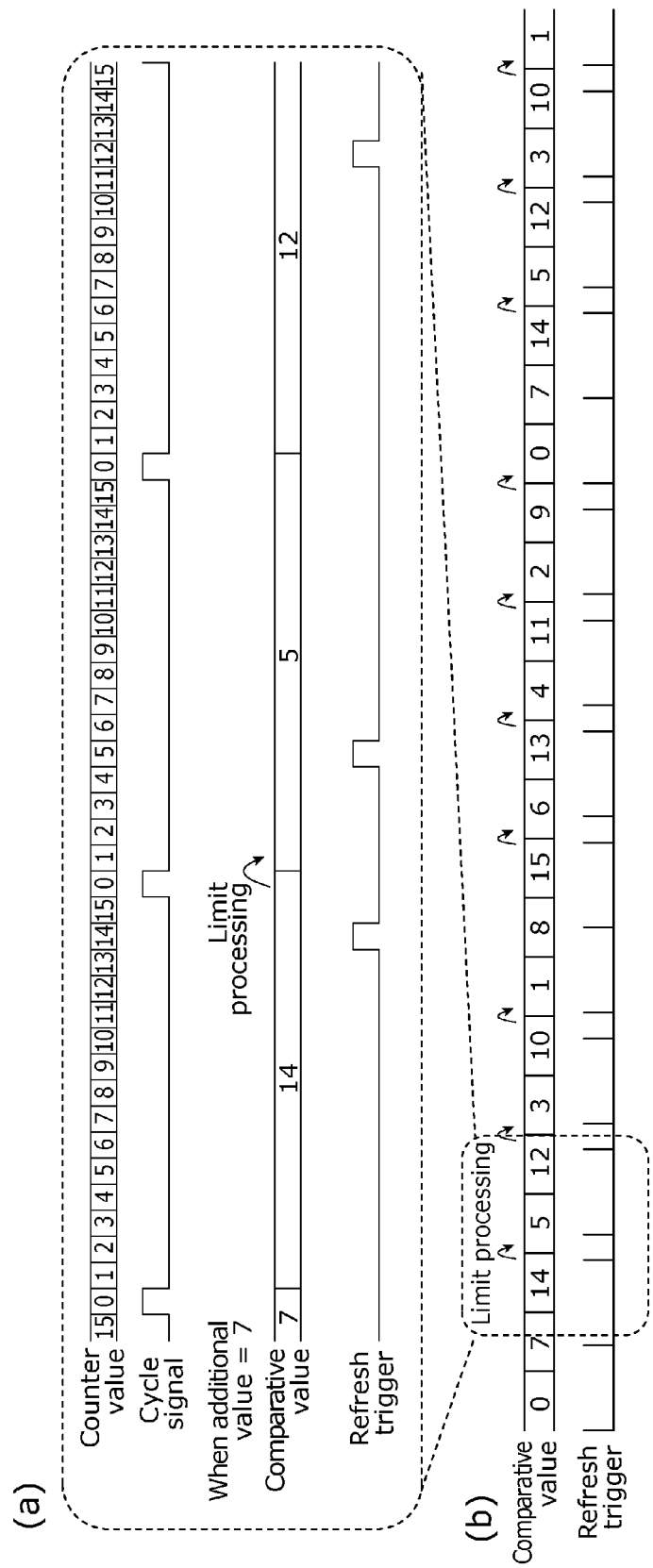
FIG. 4 is an example timing chart for describing operations of the trigger generating unit according to Embodiment 1.

FIG. 4 is an example timing chart for describing operations of the trigger generating unit 600 according to Embodiment 1. The horizontal axis in FIG. 4 represents time.

In FIG. 4, (a) is an enlarged view of a portion of a timing chart of (b).

In FIG. 4, (b) is the timing chart of comparative values and refresh triggers.

With reference to (a) and (b) of FIG. 4, the counter value is a counter value indicated by the base cycle counter 610 at each timing. As described above, the base cycle counter 610 transmits a cycle signal as a trigger (pulse) to the comparative value generating unit 620, for example, at timing of "0" indicated by the base cycle counter 610. In (a) of FIG. 4, one cycle signal corresponds to one trigger (pulse).

The comparative value shown in (a) and (b) of FIG. 4 is a comparative value at each timing when the additional value held by the additional value holding unit 623 is "7". In (a) and (b) of FIG. 4, one refresh trigger corresponds to one trigger (pulse).

As shown in (a) and (b) of FIG. 4, each time the base cycle counter 610 outputs a cycle signal, the addition unit 622 adds the additional value "7" to the comparative value held by the comparative value holding unit 621. In (a) and (b) of FIG. 4, the limit processing is performed at timing when the comparative value held by the comparative value holding unit 621 is updated from 14 to 5.

The limit processing is performed as follows. First, the first calculated value of "21" obtained by an equation of 14+7=21 is larger than 15 that is the maximum value of the counter values of the base cycle counter 610. Thus, 16 resulting from "(the maximum value of the counter values)+1" is subtracted from the first calculated value of 21 in the limit processing.

Accordingly, "5" that is the second calculated value obtained by the limit processing is set to the latest comparative value to be held by the comparative value holding unit 621.

As such, while the limit processing is performed at each base cycle, the comparative value held by the comparative value holding unit 621 is updated. Thus, the timing cycle in which the counter value of the base cycle counter 610 and the value held by the comparative value holding unit 621 match is not constant.

Here, the frequency components of the refresh triggers include two type of frequency components, that is, an interval "23" and an interval "7". The interval "23" is an interval of one of the frequency components calculated by an equation of 16+7=23 when no limit processing is performed. The interval "7" is an interval of the other one of the frequency components when the limit processing occurs (is performed).

Figure 5:
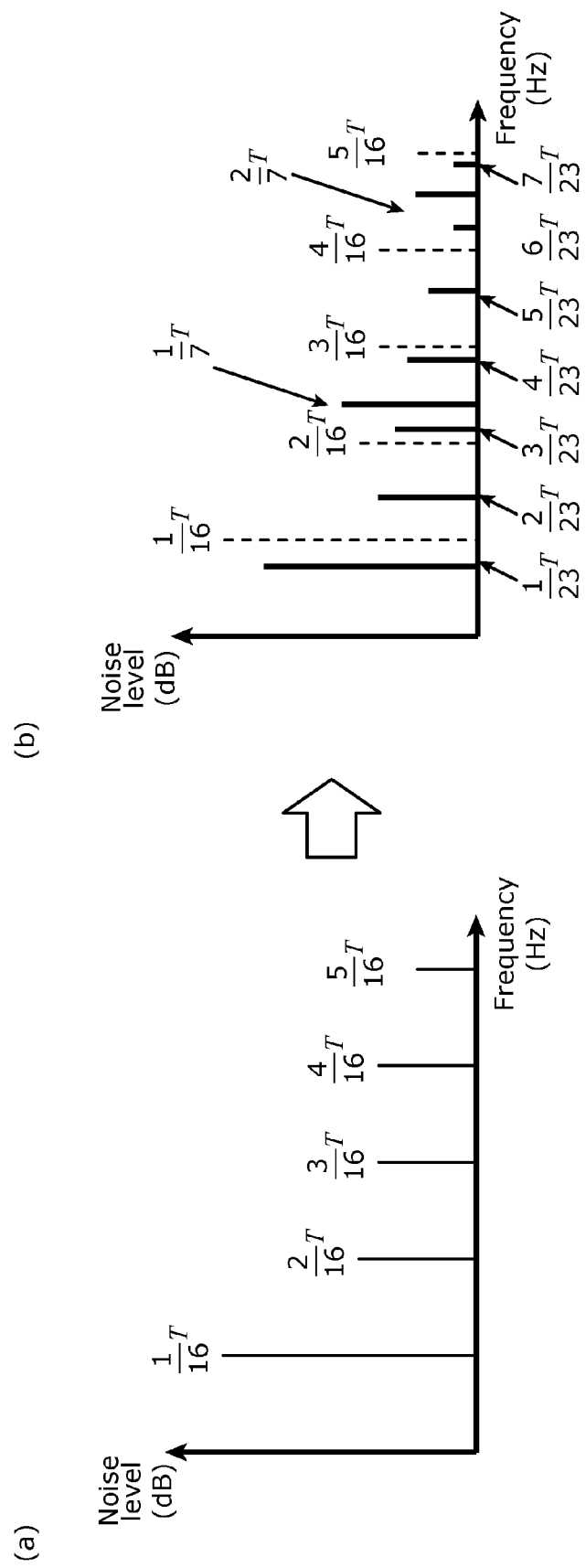
FIG. 5 shows graphs for describing refresh triggers according to Embodiment 1.

FIG. 5 shows graphs for describing refresh triggers according to Embodiment 1.

In FIG. 5, (a) is a graph representing a frequency spectrum of a signal (hereinafter referred to as constant cycle signal N) including refresh triggers when the refresh triggers are generated in a constant cycle. In other words, the constant cycle signal N is a signal representing noise in the refresh operations of the DRAM 200.

The vertical axis of (a) of FIG. 5 represents a noise level (dB) as a signal level. The horizontal axis represents a frequency (Hz).

As illustrated in (a) of FIG. 5, the constant cycle signal N is a signal representing a fundamental or harmonics that is/are peaked at a frequency N times of T/16, where N is a natural number.

In FIG. 5, (b) is a graph representing a frequency spectrum of a signal (hereinafter referred to as variable cycle signal SA) including refresh triggers in a variable cycle. The refresh triggers are generated by the trigger generating unit 600. In other words, the variable cycle signal SA is a signal representing noise in the refresh operations of the DRAM 200.

In FIG. 5, the vertical and horizontal axes of (b) are identical to those of (a). In (b) of FIG. 5, the constant cycle signal N in (a) of FIG. 5 is represented by dotted lines for comparison.

As shown in (b), the variable cycle signal SA including the refresh triggers generated by the trigger generating unit 600 includes two signals having respective types of frequency components (hereinafter referred to as signals S1 and S2). Here, the signal S1 is a signal representing the fundamental or harmonics that is/are peaked at a frequency N times of T/23. Furthermore, the signal S2 is a signal representing the fundamental or harmonics that is/are peaked at a frequency N times of T/7.

Furthermore, as shown in (b), the maximum noise level of the variable cycle signal SA is lower than that of the constant cycle signal N. Here, the variable cycle signal SA is a signal requesting the refresh operations of the DRAM 200.

In other words, the refresh control device 400 including the trigger generating unit 600 according to Embodiment 1 can reduce the level of noise (for example, the maximum noise level) caused by the cycles of the refresh triggers included in the variable cycle signal SA more than the level of noise caused by the refresh triggers generated in a constant cycle. Specifically, the refresh control device 400 can reduce the level of noise caused by the cycles of triggers for requesting refresh operations of a memory more than the level of noise caused by the triggers generated in a constant cycle.

Furthermore, the frequency at each peak of the variable cycle signal SA is a frequency obtained by shifting the frequency at each peak of the constant cycle signal N.

With application of this, for example, the peak of the frequency of the variable cycle signal SA can be shifted to any position by the CPU 320 setting the additional value held by the additional value holding unit 623 to any value. Accordingly, even when the frequency band of wireless signals is present in a harmonic domain of lower degrees (second degree, third degree, etc.) in the variable cycle signal SA, the tuner unit 311 can shift the peak to a position at which reception of wireless signals is not interfered with. In other words, it is possible to suppress degradation in a reception state of wireless signals (reception interference of wireless signals). The wireless signals are, for example, signals used by radios.

Thus, the frequency at which the tuner unit 311 receives the wireless signals is different from each frequency indicated by the signals including the refresh triggers that are in a non-constant cycle (variable cycle).

Accordingly, the refresh control device 400 including the trigger generating unit 600 according to Embodiment 1 can satisfy the refresh-rate requirements of a volatile memory (DRAM 200) and prevent signals at particular frequencies for refresh operations from interfering with reception of wireless signals.

Furthermore, the wireless receiver 1000 according to Embodiment 1 can achieve frequency shift or frequency modulation with a simple digital circuit configuration with respect to an operation clock of the system, without using an analog configuration such as a voltage controlled oscillator (VCO).

Furthermore, without changing a conventional configuration of an arbitration circuit, the memory access to the DRAM is possible with the influence on refresh operations equivalent to that using the configuration of a conventional wireless receiver.

The configuration of the trigger generating unit 600 is not limited to that for generating refresh triggers in a variable cycle. For example, the trigger generating unit 600 may have both functions of generating refresh triggers in a constant cycle and in a variable (non-constant) cycle.

Here, the refresh control device 400 has both functions of generating refresh triggers in a constant cycle and in a variable (non-constant) cycle.

In order for the trigger generating unit 600 to generate refresh triggers in a constant cycle, for example, the CPU 320 sets the additional value held by the additional value holding unit 623 to "0". Accordingly, the DRAM 200 can perform a refresh operation at the conventional timing under a condition that the reception state of wireless signals is not influenced.

Embodiment 1 describes, but not limited to, a configuration in which one refresh trigger is generated at the matching detection timing detected by the matching detection unit 630. The matching detection unit 630 may generate a series of refresh triggers at the detected matching detection timing.

In consideration that memory access to the DRAM 200 is performed, one refresh trigger is generated in one base cycle. Accordingly, the refresh timing is equalized and negative effect on the memory access becomes less.

Although the reference clock counted by the base cycle counter 610 is not particularly limited, a system clock within a memory controller to be a reference for access timing to the DRAM may be used as the reference clock. In view of the advantages of a reception state of wireless signals, a frequency-divided clock may sometimes be used as the reference clock.

Embodiment 2

Next, a trigger generating unit 600A according to Embodiment 2 will be described.

A refresh control device according to Embodiment 2 will be referred to as a refresh control device A2. The refresh control device A2 is different from the refresh control device 400 in FIG. 1 only in including the trigger generating unit 600A instead of the trigger generating unit 600. The detailed description of the refresh control device A2 other than the point is the same as that of the refresh control device 400, and thus will not be repeated.

Figure 6:
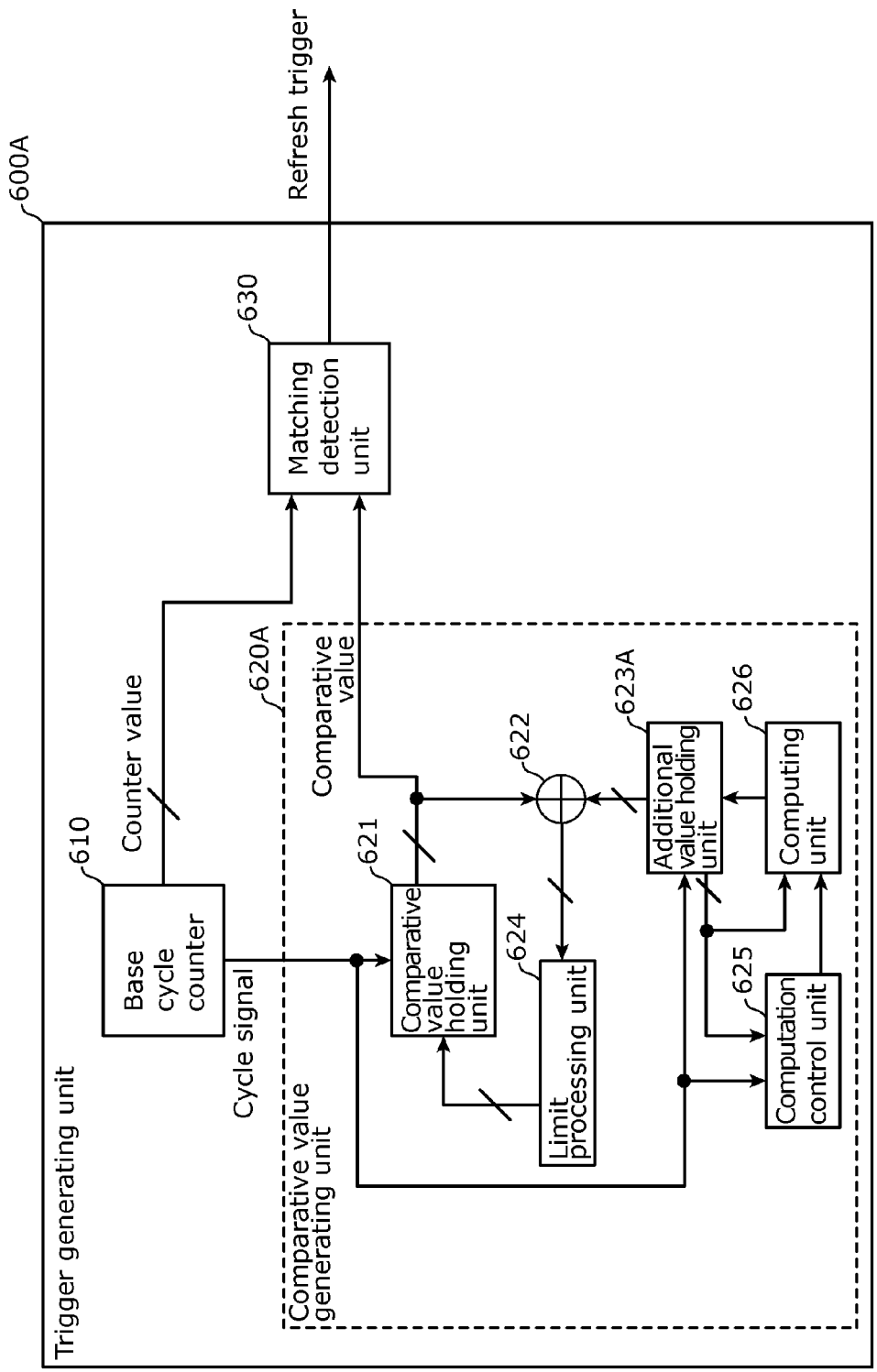
FIG. 6 is a block diagram illustrating a configuration of a trigger generating unit according to Embodiment 2.

FIG. 6 is a block diagram illustrating a configuration of the trigger generating unit 600A according to Embodiment 2. The trigger generating unit 600A is different from the trigger generating unit 600 in FIG. 3 mainly in using variable additional values.

With reference to FIG. 6, the trigger generating unit 600A is different from the trigger generating unit 600 in FIG. 3 in including a comparative value generating unit 620A instead of the comparative value generating unit 620. The detailed description of the trigger generating unit 600A other than the point is the same as that of the trigger generating unit 600, and thus will not be repeated.

The comparative value generating unit 620A is different from the comparative value generating unit 620 in FIG. 3 in including a computation control unit 625, a computing unit 626, and an additional value holding unit 623A instead of the additional value holding unit 623. The detailed description of the comparative value generating unit 620A other than the points is the same as that of the comparative value generating unit 620, and thus will not be repeated.

The base cycle counter 610 included in the trigger generating unit 600A transmits a cycle signal to the comparative value holding unit 621, the additional value holding unit 623A, and the computation control unit 625 at each base cycle.

The additional value holding unit 623A holds one additional value. The additional value is a value used in the addition processing. Furthermore, each time the additional value holding unit 623A receives the cycle signal, it continues to transmit the held latest additional value to the addition unit 622, the computation control unit 625, and the computing unit 626.

In other words, the additional value holding unit 623A holds an additional value, and outputs the held latest additional value at each base cycle.

The computation control unit 625 is a determining unit that determines whether or not the latest additional value output by the additional value holding unit 623A is the first value or the second value each time it receives the cycle signal. Here, the first value and the second value are the minimum value and the maximum value of the base cycle counter 610, respectively. For example, assume that the first value and the second value are "0" and "15", respectively.

Until the additional value reaches the maximum value of the counter values, the additional value is updated in increments of 1 at each base cycle, which will be described in detail later. Furthermore, once the additional value reaches the maximum value of the counter values, it is updated in increments of −1 at each base cycle until it reaches the minimum value.

Each time the additional value holding unit 623A outputs the latest additional value, the computing unit 626 performs computation using the additional value, which will be described in detail later.

When the latest additional value output by the additional value holding unit 623A is the first value, the computation control unit 625 issues, to the computing unit 626, instructions for incrementing the additional value by 1 at each base cycle until the additional value becomes the second value and transmitting the latest additional value to the additional value holding unit 623A each time the additional value is incremented by 1.

In other words, when the additional value held by the additional value holding unit 623A is the first value, the computation control unit 625 functioning as the second determining unit causes the computing unit 626 to increment the additional value by 1 at each base cycle until the additional value becomes the second value and to transmit the latest additional value to the additional value holding unit 623A each time the additional value is incremented by 1.

Here, the computing unit 626 performs computation for incrementing the additional value by 1 at each base cycle until the additional value becomes the second value, and transmits the latest additional value to the additional value holding unit 623A each time the additional value is incremented by 1.

Furthermore, when the latest additional value output by the additional value holding unit 623A is the second value, the computation control unit 625 issues, to the computing unit 626, instructions for decrementing the additional value by 1 at each base cycle until the additional value becomes the first value and transmitting the latest additional value to the additional value holding unit 623A each time the additional value is decremented by 1.

In other words, when the additional value held by the additional value holding unit 623A is the second value, the computation control unit 625 functioning as the second determining unit causes the computing unit 626 to decrement the additional value by 1 at each base cycle until the additional value becomes the first value and to transmit the latest additional value to the additional value holding unit 623A each time the additional value is decremented by 1.

Here, the computing unit 626 performs computation for decrementing the additional value by 1 at each base cycle until the additional value becomes the first value, and transmits the latest additional value to the additional value holding unit 623A each time the additional value is decremented by 1.

Each time the additional value holding unit 623A receives a cycle signal, it receives the latest additional value from the computing unit 626, and holds the latest additional value instead of the held additional value. In other words, the additional value holding unit 623A holds, at each base cycle, the latest additional value transmitted from the computing unit 626, instead of the held additional value.

As described above, the additional value holding unit 623A continues to transmit the held latest additional value to the addition unit 622, the computation control unit 625, and the computing unit 626 at each base cycle.

Each time the addition unit 622 receives the additional value, it performs addition processing A for adding the additional value transmitted from the additional value holding unit 623A to the comparative value transmitted from the comparative value holding unit 621. In other words, the addition unit 622 performs the addition processing A for adding the latest additional value held by the additional value holding unit 623A to the comparative value held by the comparative value holding unit 621 at each base cycle.

The value obtained in the addition processing A will be referred to as the first calculated value. Each time the addition unit 622 performs the addition processing A, it further transmits the first calculated value calculated in the addition processing A to the limit processing unit 624.

Processing performed by the limit processing unit 624 and the comparative value holding unit 621 are the same as that according to Embodiment 1, and thus will not be repeated. The processing will be simply described hereinafter.

Specifically, each time the addition unit 622 performs the addition processing A, the limit processing unit 624 functioning as the first determining unit determines whether or not the first calculated value calculated in the addition processing A is larger than the second value (maximum value (15) of the counter values).

Furthermore, when the first calculated value is larger than the second value, the limit processing unit 624 functioning as the first determining unit performs limit processing for subtracting a difference between the first value and the second value (the number of values) from the first calculated value.

Then, the limit processing unit 624 continues to transmit the second calculated value calculated in the limit processing to the comparative value holding unit 621 as the latest comparative value. Furthermore, when the first calculated value is smaller than or equal to the second value, the limit processing unit 624 functioning as the first determining unit continues to transmit the first calculated value to the comparative value holding unit 621 as the latest comparative value.

Each time the comparative value holding unit 621 receives the cycle signal, it receives the latest comparative value from the limit processing unit 624, and holds the latest comparative value instead of the held comparative value. In other words, the comparative value holding unit 621 holds the latest comparative value transmitted from the limit processing unit 624 functioning as the first determining unit at each base cycle, instead of the held comparative value.

Then, the comparative value holding unit 621 continues to transmit the held latest comparative value to the matching detection unit 630 and the addition unit 622. In other words, the comparative value holding unit 621 updates a comparative value at each base cycle and transmits the updated comparative value to the matching detection unit 630 and the addition unit 622.

As described above, the matching detection unit 630 detects a matching timing, and generates refresh triggers at the matching timing.

With the processes, the trigger generating unit 600A generates refresh triggers in a variable cycle to satisfy the refresh-rate requirements.

Figure 7:
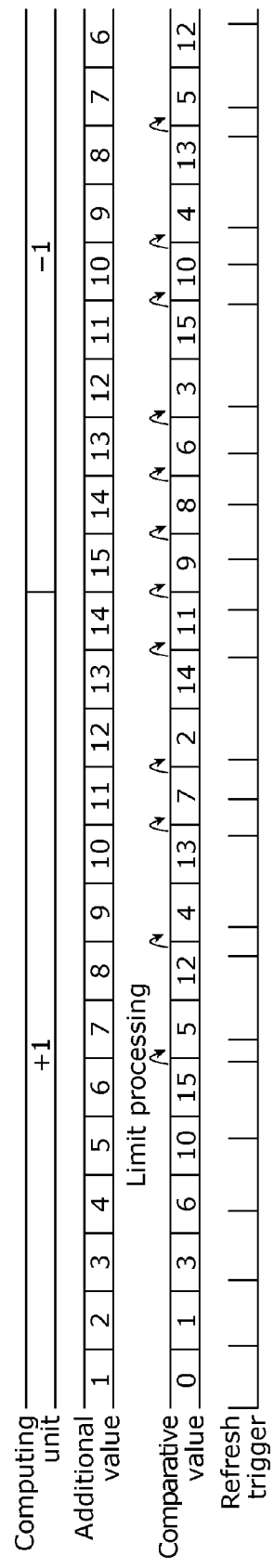
FIG. 7 is an example timing chart for describing operations of the trigger generating unit according to Embodiment 2.

FIG. 7 is an example timing chart for describing operations of the trigger generating unit 600A according to Embodiment 2. The horizontal axis in FIG. 7 represents time.

With reference to FIG. 7, the timing chart associated with a character string "Computing unit" represents processing performed by the computing unit 626. The period indicated by "+1" is a period during the time when the computing unit 626 performs computation for incrementing an additional value by 1. The period indicated by "−1" is a period during the time when the computing unit 626 performs computation for decrementing an additional value by 1.

The "Additional value" is an additional value at each timing. The "Comparative value" is a comparative value at each timing. In FIG. 7, one refresh trigger corresponds to one trigger (pulse).

Although not shown in FIG. 7, the base cycle counter 610 outputs the counter value and the cycle signal shown in (a) of FIG. 4. The counter values are, for example, values ranging from 0 to 15.

The base cycle counter 610 outputs, for example, a cycle signal as a trigger (pulse) when the base cycle counter 610 indicates "0".

During the period indicated by "+1", the computing unit 626 performs computation for incrementing the additional value by 1 at each base cycle until the additional value becomes the maximum value (15). On the other hand, during the period indicated by "−1", the computing unit 626 performs computation for decrementing the additional value by 1 at each base cycle until the additional value becomes the minimum value (0). In other words, the additional value is sweepingly updated.

Although not illustrated, when the additional value becomes the minimum value (0), that is, when the period indicated by "−1" ends, the period indicated by "+1" starts.

With repetitions of these processes, the additional value updated at each base cycle is added to the comparative value held by the comparative value holding unit 621, and the comparative value is sometimes updated by performing the limit processing.

With the processes, the trigger generating unit 600A generates refresh triggers in a variable cycle to satisfy the refresh-rate requirements.

Figure 8:
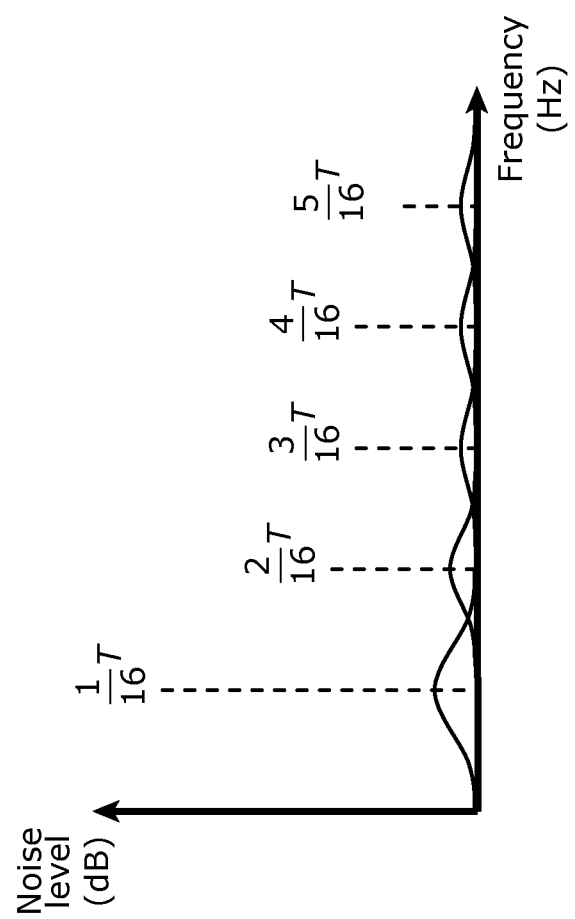
FIG. 8 shows a graph for describing refresh triggers according to Embodiment 2.

FIG. 8 shows a graph for describing refresh triggers according to Embodiment 2. Specifically, FIG. 8 is a graph representing a frequency spectrum of a signal (hereinafter referred to as variable cycle signal SA2) including refresh triggers in a variable cycle. The refresh triggers are generated by the trigger generating unit 600A according to Embodiment 2. In other words, the variable cycle signal SA2 is a signal representing noise in the refresh operations of the DRAM 200.

In FIG. 8, the vertical and horizontal axes are identical to those of (a) of FIG. 5.

In FIG. 8, the constant cycle signal N in (a) of FIG. 5 is represented by dotted lines for comparison.

As shown in FIG. 8, the variable cycle signal SA2 including the refresh triggers generated by the trigger generating unit 600A is a signal representing the fundamental or harmonics that is/are peaked at a frequency N times of T/16.

As described above, the additional value is sweepingly updated according to Embodiment 2. Accordingly, the refresh triggers are generated in a non-constant cycle.

Furthermore, as shown in FIG. 8, the maximum noise level of the variable cycle signal SA2 is substantially lower than that of the constant cycle signal N. In other words, the variable cycle signal SA2 is a signal obtained by averagely spreading the peak levels of the constant cycle signal N and substantially reducing (attenuating) the noise level of the fundamental and harmonics of the constant cycle signal N.

In other words, the refresh control device A2 including the trigger generating unit 600A according to Embodiment 2 can reduce the level of noise caused by the cycles of the refresh triggers included in the variable cycle signal SA2 more than the level of noise caused by the refresh triggers generated in a constant cycle. In other words, the refresh control device A2 can reduce the level of noise caused by the cycles of triggers for requesting refresh operations of a memory more than the level of noise caused by the triggers generated in a constant cycle.

Accordingly, even when the frequency band of wireless signals is present in a harmonic domain of a relatively higher degree, a wireless receiver including the trigger generating unit 600A can substantially suppress degradation in a reception state (reception interference) of wireless signals received by the tuner unit 311. In other words, the wireless receiver including the trigger generating unit 600A according to Embodiment 2 can substantially suppress degradation in a reception state (reception interference) of wireless signals.

The configuration of the trigger generating unit 600A is not limited to that for generating refresh triggers in a variable cycle. For example, the trigger generating unit 600A may have both functions of generating refresh triggers in a constant cycle and in a variable cycle.

Here, the refresh control device A2 has both functions of generating refresh triggers in a constant cycle and in a variable cycle.

In order for the trigger generating unit 600A to generate refresh triggers in a constant cycle, for example, the CPU 320 controls the additional value holding unit 623A so as to set the additional value output by the additional value holding unit 623A to a fixed value. Accordingly, the DRAM 200 can perform a refresh operation at the conventional timing under a condition that the reception state of wireless signals is not influenced.

Embodiment 3

Next, a trigger generating unit 600B according to Embodiment will be described. A refresh control device according to Embodiment 3 will be referred to as a refresh control device A3. The refresh control device A3 is different from the refresh control device 400 in FIG. 1 only in including the trigger generating unit 600B instead of the trigger generating unit 600. The detailed description of the refresh control device A3 other than the point is the same as that of the refresh control device 400, and thus will not be repeated.

Figure 9:
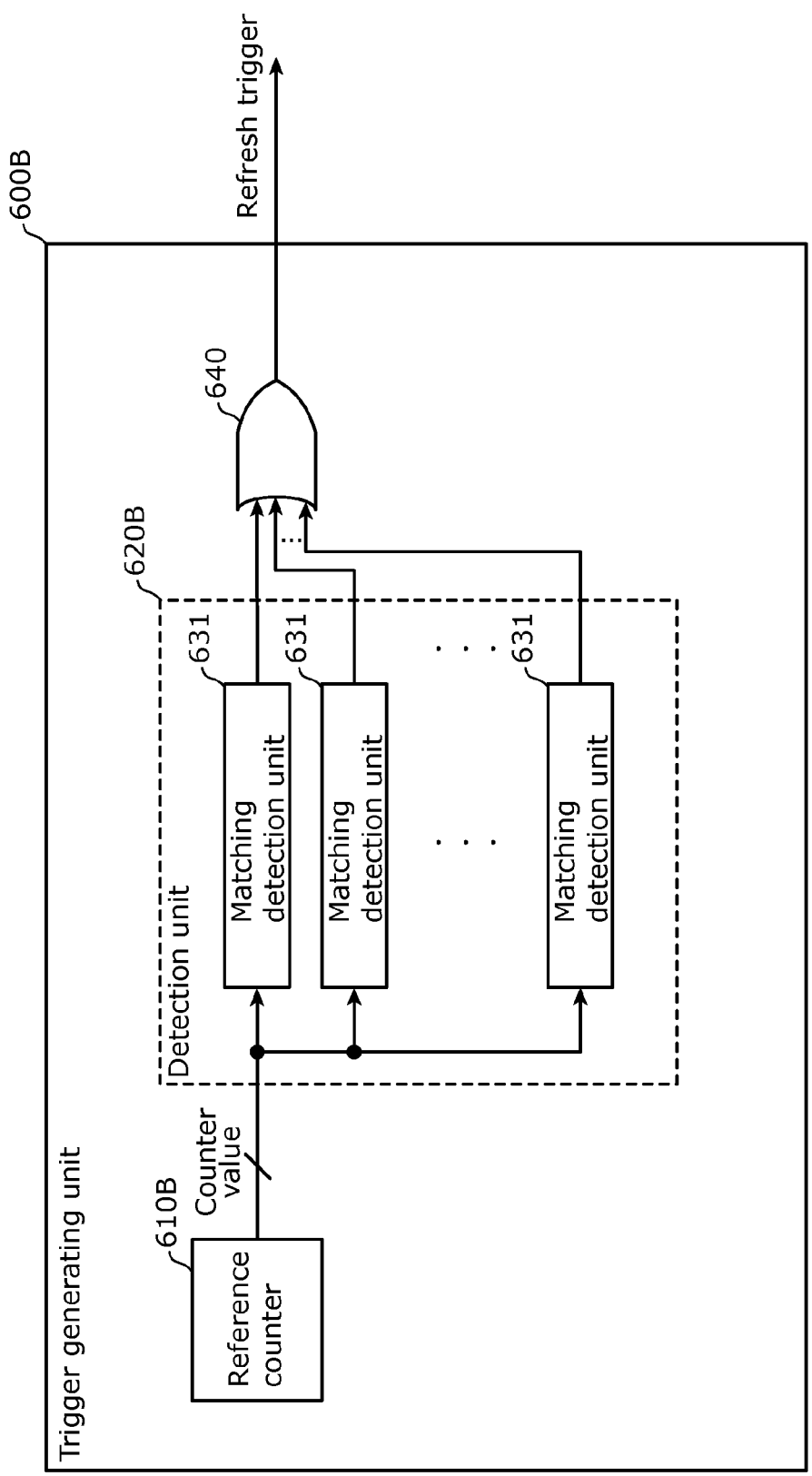
FIG. 9 is a block diagram illustrating a configuration of a trigger generating unit according to Embodiment 3.

FIG. 9 is a block diagram illustrating a configuration of the trigger generating unit 600B according to Embodiment 3.

The trigger generating unit 6008 is different from the trigger generating unit 600 in FIG. 3 mainly in using a different counter cycle.

With reference to FIG. 9, the trigger generating unit 6008 includes a reference counter 6108, a detection unit 620B, and a logical OR computing unit 640.

The base cycle counter 610 is a counter for outputting a refresh trigger in a circulation cycle of the base cycle counter 610. In contrast, the reference counter 6108 is a counter for outputting a refresh trigger M times in a circulation cycle of the reference counter 610B, where M is an integer larger than or equal to 2.

The reference counter 6108 is, for example, a counter sequentially indicating (counting) counter values from the first value to the third value in a division cycle that is M or more times as large as the base cycle that satisfies the refresh-rate requirements, where M is an integer larger than or equal to 2. In other words, the base cycle counter 610B sequentially indicates (counts) the counter values from the first value to the third value in the division cycle. Here, the first value and the third value are the minimum value and the maximum value indicated by the reference counter 610B, respectively. For example, assume that the first value and the third value are "0" and "47", respectively.

In other words, the base cycle counter 610B is a counter that sequentially indicates values from the first value to the third value larger than the first value in the division cycle that is M or more times as large as the base cycle that satisfies the refresh-rate requirements, where M is an integer larger than or equal to 2. Furthermore, the base cycle counter 610B is a counter that indicates the same value at each division cycle.

The detection unit 620B includes M matching detection units 631, where M is an integer larger than or equal to 2. In other words, the trigger generating unit 600B includes the M matching detection units 631.

Each time the counter value indicated by the reference counter 610B is changed, the reference counter 610B transmits the latest counter value to each of the M matching detection units 631.

The M matching detection units 631 hold different comparative values. The comparative values held by the M matching detection units 631 are values, for example, set by an external CPU and others.

In other words, each of the M matching detection units 631 holds one of the values from the first value to the third values as a comparative value. The M comparative values held by the M matching detection units 631 are different from each other.

Each of the M matching detection units 631 detects a matching timing at which the latest counter value received from the reference counter 610B and the comparative value held by the matching detection unit 631 match. Then, the matching detection unit 631 generates a trigger as a refresh trigger at the detected matching timing.

In other words, each of the M matching detection units 631 detects the matching timing at which the value indicated by the reference counter 610B and the comparative value held by the matching detection unit 631 match, and generates a trigger at the matching timing. Each of the M matching detection units 631 transmits the trigger (pulse) to the logical OR computing unit 640 at the detected matching timing.

The M matching detection units 631 transmit triggers (pulses) to the logical OR computing unit 640 at different timings.

The logical OR computing unit 640 performs a logical OR operation on each of the triggers (pulses) received from the M matching detection units 631. In other words, the logical OR computing unit 640 is a generating unit that generates, as the refresh triggers, the triggers generated by the M matching detection units 631 at different timings.

When the M comparative values held by the M matching detection units 631 are arranged in ascending order, absolute values of differences each between succeeding two of the comparative values are different from each other. Accordingly, the trigger generating unit 600B generates refresh triggers in a variable cycle.

Thus, the occurrence cycles of refresh requests satisfy the refresh-rate requirements, and cannot be constant.

With the processes, the trigger generating unit 600B generates refresh triggers in a variable cycle to satisfy the refresh-rate requirements.

Here, the base cycle of the reference counter 610B that satisfies the refresh-rate requirements is within N clocks. Furthermore, assume that the division cycle of the reference counter 610B is N×M. Here, the detection unit 620B outputs M refresh triggers at least per one division cycle.

Figure 10:
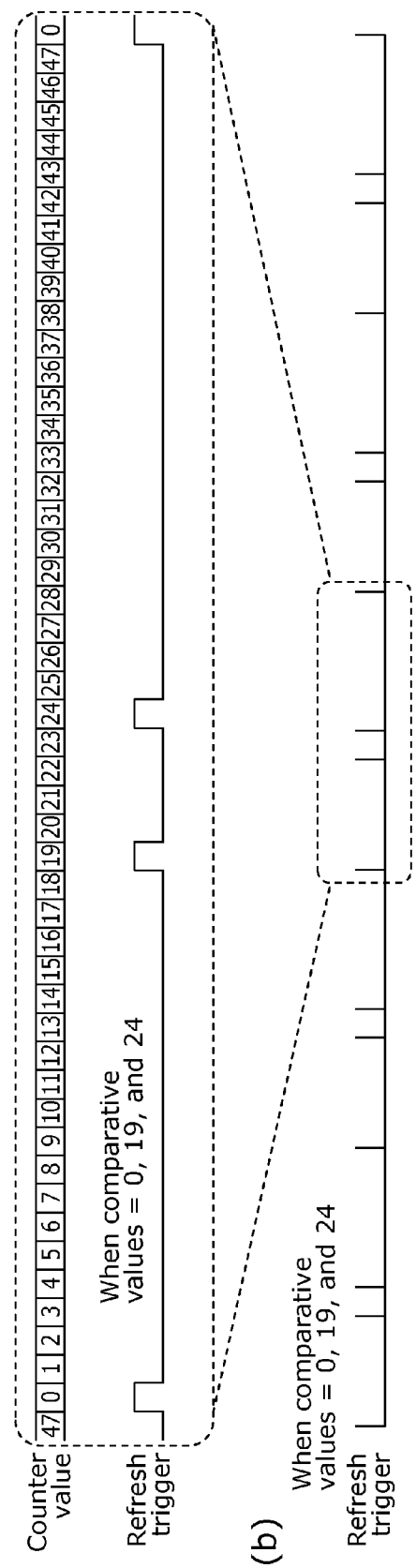
FIG. 10 is an example timing chart for describing operations of the trigger generating unit according to Embodiment 3.

FIG. 10 is an example timing chart for describing operations of the trigger generating unit 600B according to Embodiment 3. The horizontal axis in FIG. 10 represents time.

Here, assume N=16 as the base cycles of the reference counter 610B and M=3. Here, the detection unit 620B includes three matching detection units 631. Furthermore, three comparative values held by the three matching detection units 631 are "0", "19", and "24".

Furthermore, the reference counter 610B sequentially indicates values from "0" to "47". In other words, the cycle in which the values from "0" to "47" are counted is one cycle of the reference counter 610B.

In FIG. 10, (a) is an enlarged view of a portion of a timing chart of (b).

In (a) of FIG. 10, the counter value is a counter value indicated by the reference counter 6108 at each timing.

In FIG. 10, (b) is the timing chart of refresh triggers.

As shown in (a) and (b) of FIG. 10, the trigger generating unit 600B generates refresh triggers at timing when the counter values of the reference counter 610B are "0", "19", and "24".

The three comparative values held by the three matching detection units 631 are not limited to "0", "19", and "24". When the M comparative values are arranged in ascending order, absolute values of differences each between succeeding two of the comparative values have only to be different from each other. For example, the three comparative values held by the three matching detection units 631 may be "0", "17", and "35".

With the processes, the peak of frequencies of refresh noise can be shifted to any position by setting the comparative values held by the M matching detection units 631 to any values.

Hereinafter, a signal generated by the trigger generating unit 6008 according to Embodiment 3 and including refresh triggers in a variable cycle will be referred to as a variable cycle signal SA3.

The trigger generating unit 600B generates refresh triggers in a variable cycle. In other words, the refresh control device A3 including the trigger generating unit 600B according to Embodiment 3 can reduce the level of noise (for example, the maximum noise level) caused by the cycles of the refresh triggers included in the variable cycle signal SA3 more than the level of noise caused by the refresh triggers generated in a constant cycle. In other words, the refresh control device A3 can reduce the level of noise caused by the cycles of triggers for requesting refresh operations of a memory more than the level of noise caused by the triggers generated in a constant cycle.

In the trigger generating unit 600B according to Embodiment 3, the cycle of the reference counter 610B is a division cycle at least two or more times as large as the cycle that satisfies the refresh-rate requirements. With the configuration, the shift amount in cycles of refresh triggers can be increased more than those according to Embodiments 1 and 2. For example, when M=3, the shift amount in peak of the frequencies of the variable cycle signal SA3 can be three times as large as the shift amount according to Embodiment 1.

Thus, an intensive refresh operation can be performed on the DRAM 200 in a range where negative effect on the memory access is allowable. Furthermore, it is possible to achieve the frequency shift so that a shifted frequency does not overlap with the frequency band for receiving wireless signals.

The comparative values held by the M matching detection units 631 may be fixed values or variable values set by the CPU 320.

The configuration of the trigger generating unit 600B is not limited to that for generating refresh triggers in a variable cycle. For example, the trigger generating unit 600B may have both functions of generating refresh triggers in a constant cycle and in a variable cycle.

Here, the refresh control device A3 according to Embodiment 3 has both of the functions of generating refresh triggers in a constant cycle and in a variable cycle.

In order for the trigger generating unit 600B to generate refresh triggers in a constant cycle, for example, when the M comparative values are arranged in ascending order, absolute values of differences each between succeeding two of the comparative values have only to be different from each other. For example, three comparative values held by the three matching detection units 631 have only to be "0", "16", and "32".

The trigger generating unit 600B generates refresh triggers in a variable cycle. Accordingly, the DRAM 200 can perform a refresh operation at the conventional timing under a condition that the reception state of wireless signals is not influenced.

Although the reference clock counted by the reference counter 610B is not particularly limited, a system clock within a memory controller to be a reference for access timing to the DRAM may be used as a reference clock. In view of the advantages of a reception state of wireless signals, a frequency-divided clock may sometimes be used as the reference clock.

Embodiment 4

Next, a trigger generating unit 600C according to Embodiment will be described. A refresh control device according to Embodiment 4 will be referred to as a refresh control device A4. The refresh control device A4 is different from the refresh control device 400 in FIG. 1 only in including the trigger generating unit 600C instead of the trigger generating unit 600. The detailed description of the refresh control device A4 other than the point is the same as that of the refresh control device 400, and thus will not be repeated.

Figure 11:
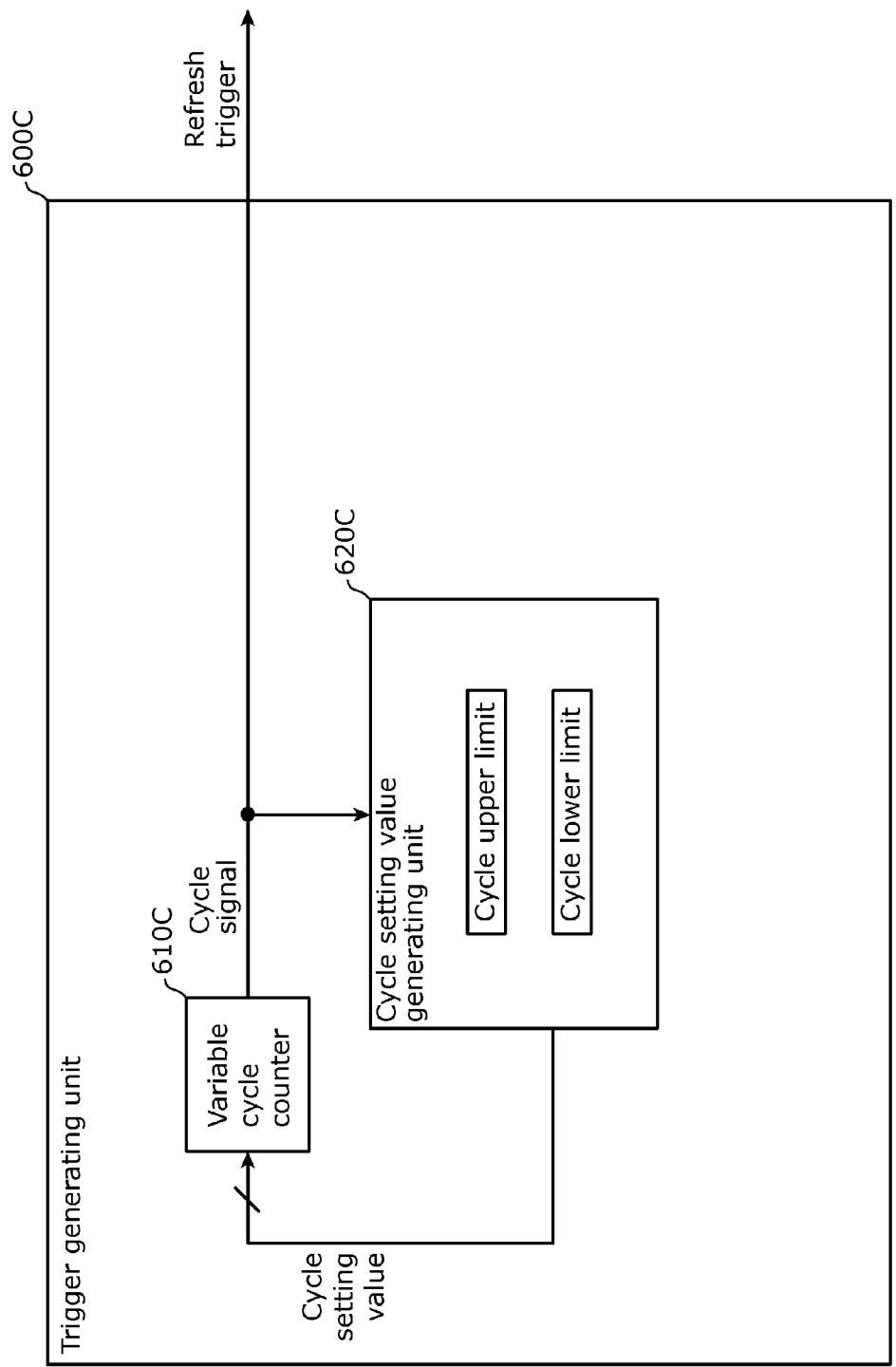
FIG. 11 is a block diagram illustrating a configuration of a trigger generating unit according to Embodiment 4.

FIG. 11 is a block diagram illustrating a configuration of the trigger generating unit 600C according to Embodiment 4.

With reference to FIG. 11, the trigger generating unit 600C includes a variable cycle counter 610C and a cycle setting value generating unit 620C.

The cycle setting value generating unit 620C generates a variable cycle setting value. The cycle setting value is a value for determining timing at which refresh triggers are generated.

The variable cycle counter 610C counts only a variable cycle setting value, and transmits a cycle signal to the cycle setting value generating unit 620C as a trigger (pulse) each time the counting ends.

In other words, the variable cycle counter 610C counts only a variable cycle setting value, and generates a cycle signal as a trigger (pulse) each time the counting ends.

Each time the cycle setting value generating unit 620C receives the cycle signal, it outputs a different value to the variable cycle counter 610C as a cycle setting value to be counted by the variable cycle counter 610C, using a cycle upper limit and a cycle lower limit to be described later.

In other words, each time the variable cycle counter 610C generates a trigger, the cycle setting value generating unit 620C outputs a different value to the variable cycle counter 610C as a cycle setting value to be counted by the variable cycle counter 610C.

Each time the cycle setting value generating unit 620C receives a cycle signal, it updates the cycle setting value to be a value within a range determined by two different values, that is, a cycle upper limit and a cycle lower limit.

Furthermore, the variable cycle counter 610C generates, as a refresh trigger, the trigger generated each time the counting ends. In other words, the variable cycle counter 610C transmits the refresh trigger to the refresh request unit 710 each time the counting ends.

Accordingly, the occurrence cycles of refresh requests satisfy the refresh-rate requirements, and cannot be constant.

Figure 12:
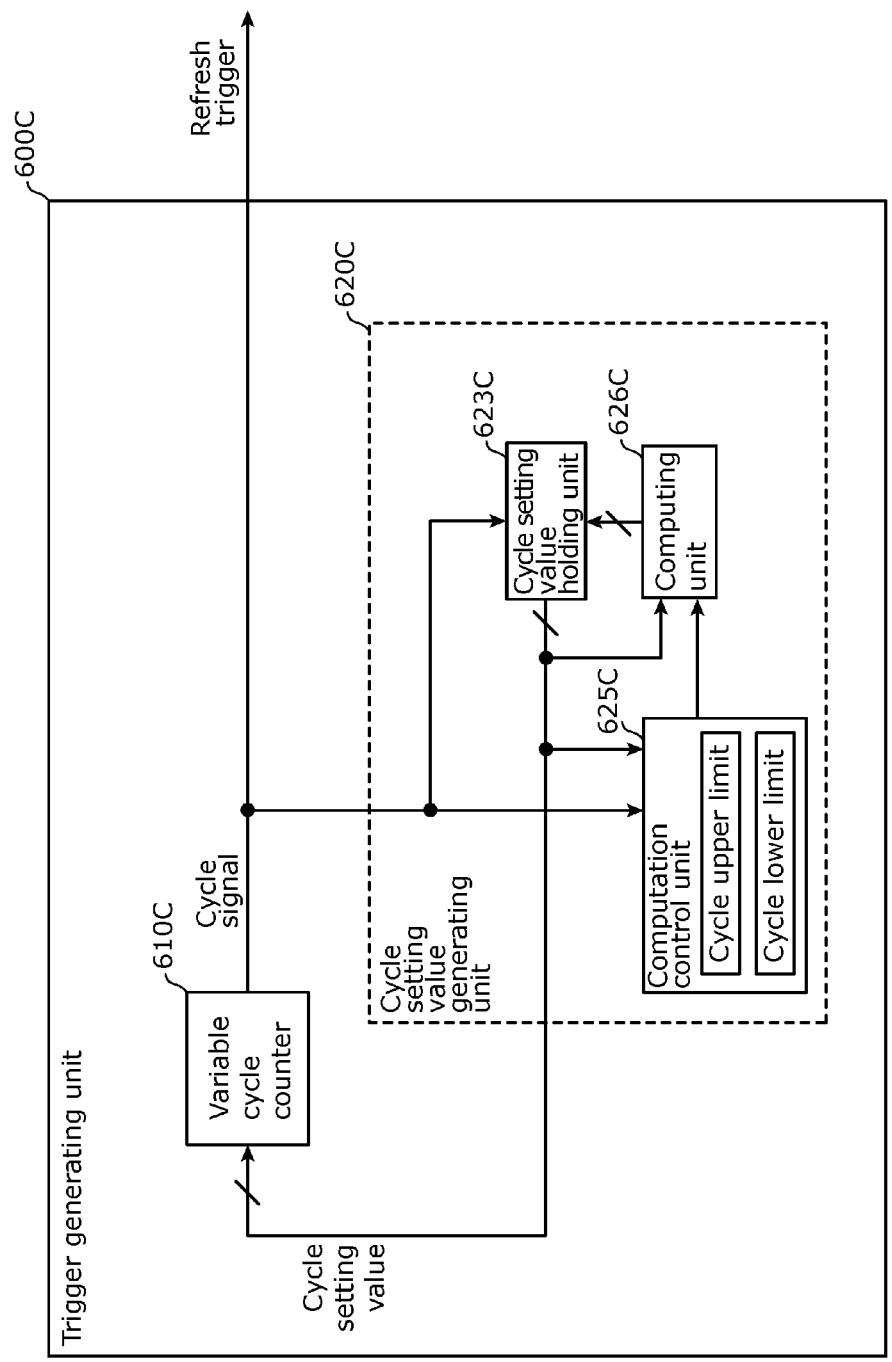
FIG. 12 is a block diagram illustrating a configuration of a cycle setting value generating unit according to Embodiment 4.

FIG. 12 is a block diagram illustrating a configuration of the cycle setting value generating unit 620C according to Embodiment 4.

With reference to FIG. 12, the cycle setting value generating unit 620C includes a cycle setting value holding unit 623C, a computation control unit 625C, and a computing unit 626C.

Each time the variable cycle counter 610C ends counting, it transmits a cycle signal to the cycle setting value holding unit 623C and the computation control unit 625C.

The cycle setting value holding unit 623C holds one cycle setting value. Each time the cycle setting value holding unit 623C receives a cycle signal as a trigger, it continues to transmit the held latest cycle setting value to the variable cycle counter 610C, the computation control unit 625C, and the computing unit 626C.

In other words, the cycle setting value holding unit 623C holds the cycle setting value, and outputs the held latest cycle setting value at least to the variable cycle counter 610C each time the variable cycle counter 610C generates a trigger.

The cycle setting value is set to a value between a cycle upper limit and a cycle lower limit. In other words, the cycle setting value output by the cycle setting value generating unit 620C is one of values between the fourth value (cycle lower limit) and the fifth value (cycle upper limit) that is larger than the fourth value.

The cycle lower limit is a value obtained by subtracting 1/u of a specified value from the specified value, where the specified value corresponds to a base cycle that satisfies the refresh-rate requirements and u is an integer larger than or equal to 2. Here, the specified value corresponding to the base cycle is the number to be counted by the base cycle counter 610B in the base cycle.

The cycle upper limit is a value obtained by adding the 1/u of the specified value to the specified value. In other words, the cycle lower limit and the cycle upper limit are values computed with respect to the specified value corresponding to the base cycle.

Specifically, the cycle lower limit and the cycle upper limit have only to be set so that a median value between the cycle lower limit and the cycle upper limit is equal to the specified value corresponding to the cycle that satisfies the refresh-rate requirements. As a result, when a series of updates on the cycle setting value with the processes ends, an average cycle of the cycle signals output from the variable cycle counter 610C can satisfy the refresh-rate requirements.

The cycle lower limit and the cycle upper limit may, not limited to the values set in accordance with the refresh-rate requirements, be set to any values.

Here, assume the specified value corresponding to the base cycle that satisfies the refresh-rate requirements as, for example, "16". The specified value corresponding to the base cycle that satisfies the refresh-rate requirements is a cycle setting value that satisfies the refresh-rate requirements. Furthermore, assume u=4. Here, the cycle lower limit and the cycle upper limit are "12" and "20", respectively.

The computation control unit 625C holds the cycle lower limit and the cycle upper limit.

Furthermore, the computation control unit 625C is a determining unit that determines whether or not the latest cycle setting value output by the cycle setting value holding unit 623C is the fourth value (cycle lower limit) or the fifth value (cycle upper limit).

Until the cycle setting value reaches the cycle upper limit, it is updated in increments of 1 at output timing of a cycle signal, which will be described in detail later. Furthermore, when the cycle setting value reaches the cycle upper limit, it is updated in increments of −1 at output timing of a cycle signal.

Each time the cycle setting value holding unit 623C outputs the latest cycle setting value, the computing unit 626C performs computation using the cycle setting value, which will be described in detail later.

When the latest cycle setting value output by the cycle setting value holding unit 623C is the cycle lower limit (fourth value), the computation control unit 625C issues, to the computing unit 626C, instructions for incrementing the cycle setting value by 1 until the cycle setting value becomes the cycle upper limit (fifth value) and transmitting the latest cycle setting value to the cycle setting value holding unit 623C each time the cycle setting value is incremented by 1.

In other words, when the cycle setting value held by the cycle setting value holding unit 623C is the fourth value, the computation control unit 625 functioning as a determining unit causes the computing unit 626C to increment the cycle setting value by 1 until the cycle setting value becomes the fifth value and to transmit the latest cycle setting value to the cycle setting value holding unit 623C each time the cycle setting value is incremented by 1.

Here, the computing unit 626C performs computation for incrementing the cycle setting value by 1 at each output timing of a cycle signal until the cycle setting value becomes the cycle upper limit (fifth value), and transmits the latest cycle setting value to the cycle setting value holding unit 623C each time the cycle setting value is incremented by 1.

When the latest cycle setting value output by the cycle setting value holding unit 623C is the cycle upper limit (fifth value), the computation control unit 625C issues, to the computing unit 626C, instructions for decrementing the cycle setting value by 1 until the cycle setting value becomes the cycle lower limit (fourth value) and transmitting the latest cycle setting value to the cycle setting value holding unit 623C each time the cycle setting value is decremented by 1.

In other words, when the cycle setting value held by the cycle setting value holding unit 623C is the fifth value, the computation control unit 625 functioning as the determining unit causes the computing unit 626C to decrement the cycle setting value by 1 until the cycle setting value becomes the fourth value and to transmit the latest cycle setting value to the cycle setting value holding unit 623C each time the cycle setting value is decremented by 1.

Here, the computing unit 626C performs computation for decrementing the cycle setting value by 1 at each output timing of a cycle signal until the cycle setting value becomes the cycle lower limit (fourth value), and transmits the latest cycle setting value to the cycle setting value holding unit 623C each time the cycle setting value is decremented by 1.

Each time the cycle setting value holding unit 623C receives a cycle signal from the variable cycle counter 610C as a trigger, it receives the latest cycle setting value from the computing unit 626C, and holds the latest cycle setting value instead of the held cycle setting value. In other words, each time the variable cycle counter 610C generates a trigger, the cycle setting value holding unit 623C holds the latest cycle setting value transmitted from the computing unit 626C instead of the held cycle setting value.

As described above, each time the variable cycle counter 610C generates a trigger, the cycle setting value holding unit 623C continues to transmit the held latest cycle setting value to the variable cycle counter 610C, the computation control unit 625C, and the computing unit 626C.

Then, the variable cycle counter 610C counts only the latest cycle setting value, and generates a cycle signal as a trigger each time the counting ends. Furthermore, as described above, the variable cycle counter 610C generates, as a refresh trigger, the trigger generated each time the counting ends.

As described above, the cycle setting value to be transmitted to the variable cycle counter 610C is a variable value. Thus, the trigger generating unit 600C generates refresh triggers in a variable cycle. In other words, the trigger generating unit 600C generates refresh triggers in a variable cycle to satisfy the refresh-rate requirements.

Hereinafter, a signal generated by the trigger generating unit 600C according to Embodiment 4 and including refresh triggers in a variable cycle will be referred to as a variable cycle signal SA4.

The trigger generating unit 600C generates refresh triggers in a variable cycle. Thus, the refresh control device A4 including the trigger generating unit 600C according to Embodiment 4 can reduce the level of noise caused by the cycles of the refresh triggers included in the variable cycle signal SA4 more than the level of noise caused by the refresh triggers generated in a constant cycle. In other words, the refresh control device A4 can reduce the level of noise caused by the cycles of triggers for requesting refresh operations of a memory more than the level of noise caused by the triggers generated in a constant cycle.

Figure 13:
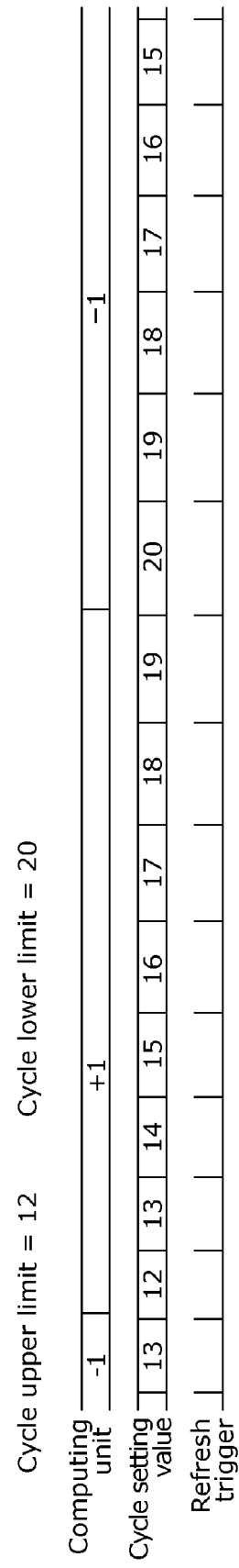
FIG. 13 is an example timing chart for describing operations of the trigger generating unit according to Embodiment 4.

FIG. 13 is an example timing chart for describing operations of the trigger generating unit 600C according to Embodiment 4. The horizontal axis in FIG. 13 represents time. FIG. 13 is a timing chart when the cycle upper limit=12 and the cycle lower limit=20.

With reference to FIG. 13, the timing chart associated with a character string "Computing unit" represents processing performed by the computing unit 626C. The period indicated by "+1" is a period during the time when the computing unit 626C performs computation for incrementing a cycle setting value by 1. The period indicated by "−1" is a period during the time when the computing unit 626C performs computation for decrementing a cycle setting value by 1.

The "Cycle setting value" is a cycle setting value at each timing.

In FIG. 13, one refresh trigger corresponds to one trigger (pulse).

As illustrated in FIG. 13, as the cycle setting value is larger, the cycle of the refresh trigger is longer. In other words, the trigger generating unit 600C generates refresh triggers in a variable cycle.

Increase in setting width for the cycle upper limit and the cycle lower limit produces greater advantages of spreading the peaks of refresh noise. Here, the setting width is a value to be added to or subtracted from the specified value corresponding to the base cycle.

However, when the cycle setting value is updated with up-down count operations, a local portion in which the refresh operation is intensively performed appears.

For example, the refresh cycle is locally twice as long as an average cycle by setting a tolerance rating of ±50 percent to a setting width (in the example above, the cycle upper limit is 24 and the cycle lower limit is 8). In other words, the cycle upper limit and the cycle lower limit that are optimal for the system can be determined in consideration of memory access to the DRAM.

The cycle upper limit and the cycle lower limit may be fixed values or variable values set by the CPU 320.

The configuration of the trigger generating unit 600C is not limited to that for generating refresh triggers in a variable cycle. For example, the trigger generating unit 600C may have both functions of generating refresh triggers in a constant cycle and in a variable cycle.

Here, the refresh control device A4 according to Embodiment 4 has both of the functions of generating refresh triggers in a constant cycle and in a variable cycle.

In order for the trigger generating unit 600C to generate refresh triggers in a constant cycle, for example, the CPU 320 has only to control the cycle setting value holding unit 623C so as to set the cycle setting value output by the cycle setting value holding unit 623C to a fixed value.

Here, the trigger generating unit 600C generates refresh triggers in a constant cycle. Accordingly, the DRAM 200 can perform a refresh operation at the conventional timing under a condition that the reception state of wireless signals is not influenced.

Embodiment 5

Next, a trigger generating unit 600D according to Embodiment will be described. A refresh control device according to Embodiment 5 will be referred to as a refresh control device A5. The refresh control device A5 is different from the refresh control device 400 in FIG. 1 only in including a trigger generating unit 600D instead of the trigger generating unit 600. The detailed description of the refresh control device A5 other than the point is the same as that of the refresh control device 400, and thus will not be repeated.

The trigger generating unit 600D is different from the trigger generating unit 600C in FIG. 11 mainly in using an M-sequence cyclic code generating unit 627. The cycle setting value is updated using an M-sequence cyclic code generated by the M-sequence cyclic code generating unit 627, which will be described in detail later.

Figure 14:
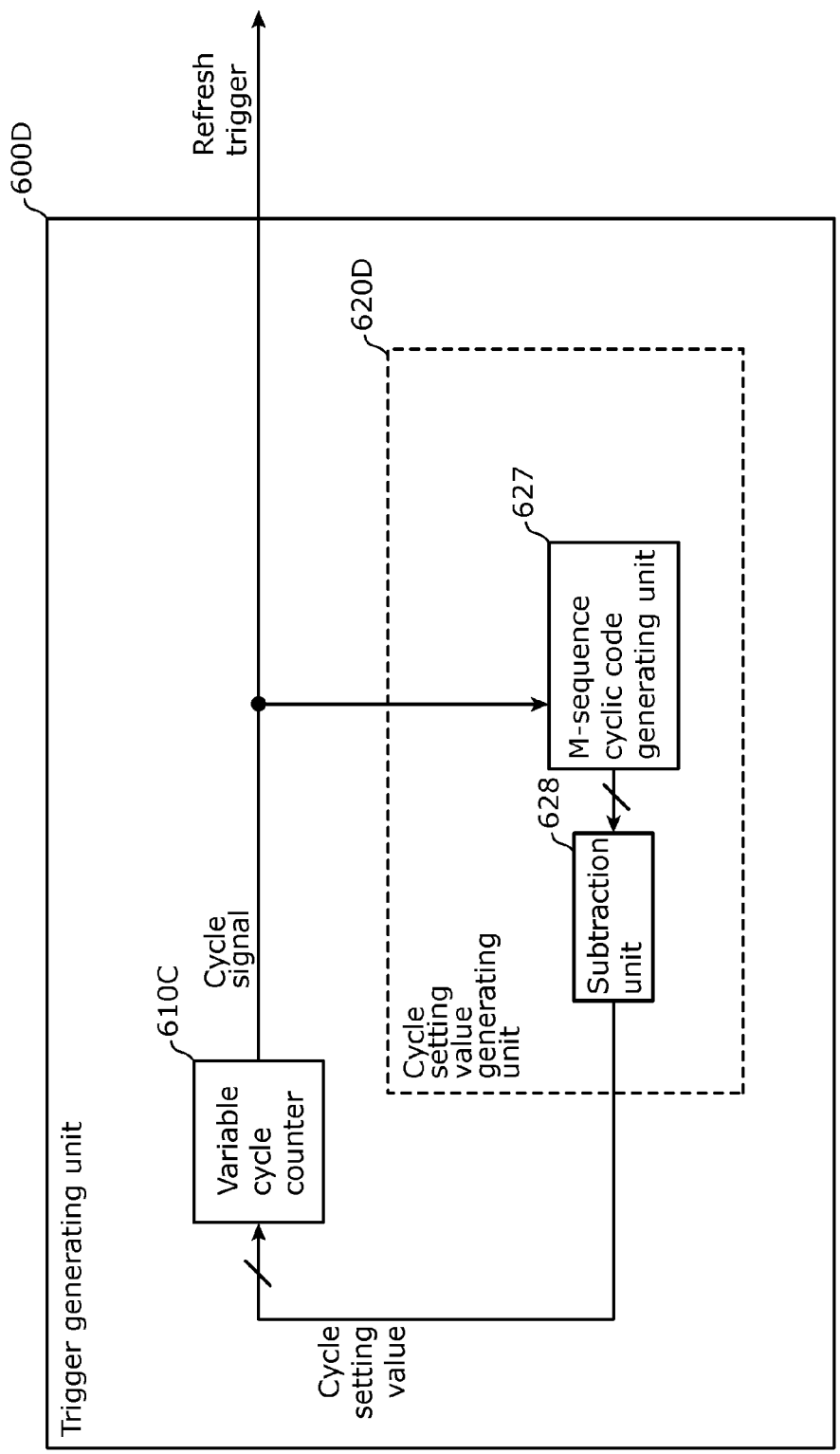
FIG. 14 is a block diagram illustrating a configuration of a trigger generating unit according to Embodiment 5.

FIG. 14 is a block diagram illustrating a configuration of the trigger generating unit 600D according to Embodiment 5.

With reference to FIG. 14, the trigger generating unit 600D is different from the trigger generating unit 600C in FIG. 11 in including a cycle setting value generating unit 620D instead of the cycle setting value generating unit 620C. The detailed description of the trigger generating unit 600D other than the point is the same as that of the trigger generating unit 600C, and thus will not be repeated.

The variable cycle counter 610C counts only a variable cycle setting value, and transmits a cycle signal to the cycle setting value generating unit 620D as a trigger (pulse) each time the counting ends, as according to Embodiment 4.

In other words, the variable cycle counter 610C counts only a variable cycle setting value, and generates a cycle signal as a trigger (pulse) each time the counting ends.

Each time the cycle setting value generating unit 620D receives the cycle signal, it outputs a random value to the variable cycle counter 610C as a cycle setting value.

In other words, each time the cycle setting value generating unit 620D receives the cycle signal, it outputs a different value to the variable cycle counter 610C as a cycle setting value to be counted by the variable cycle counter 610C, similarly as the cycle setting value generating unit 620C in FIG. 11.

In other words, each time the variable cycle counter 610C generates a trigger, the cycle setting value generating unit 620D outputs a different value to the variable cycle counter 610C as a cycle setting value to be counted by the variable cycle counter 610C.

Furthermore, the variable cycle counter 610C generates, as a refresh trigger, the trigger generated each time the counting ends.

The cycle setting value generating unit 620D includes the M-sequence cyclic code generating unit 627 and a subtraction unit 628. The variable cycle counter 610C transmits a cycle signal to the M-sequence cyclic code generating unit 627 as a trigger (pulse) each time the counting ends.

Figure 15:
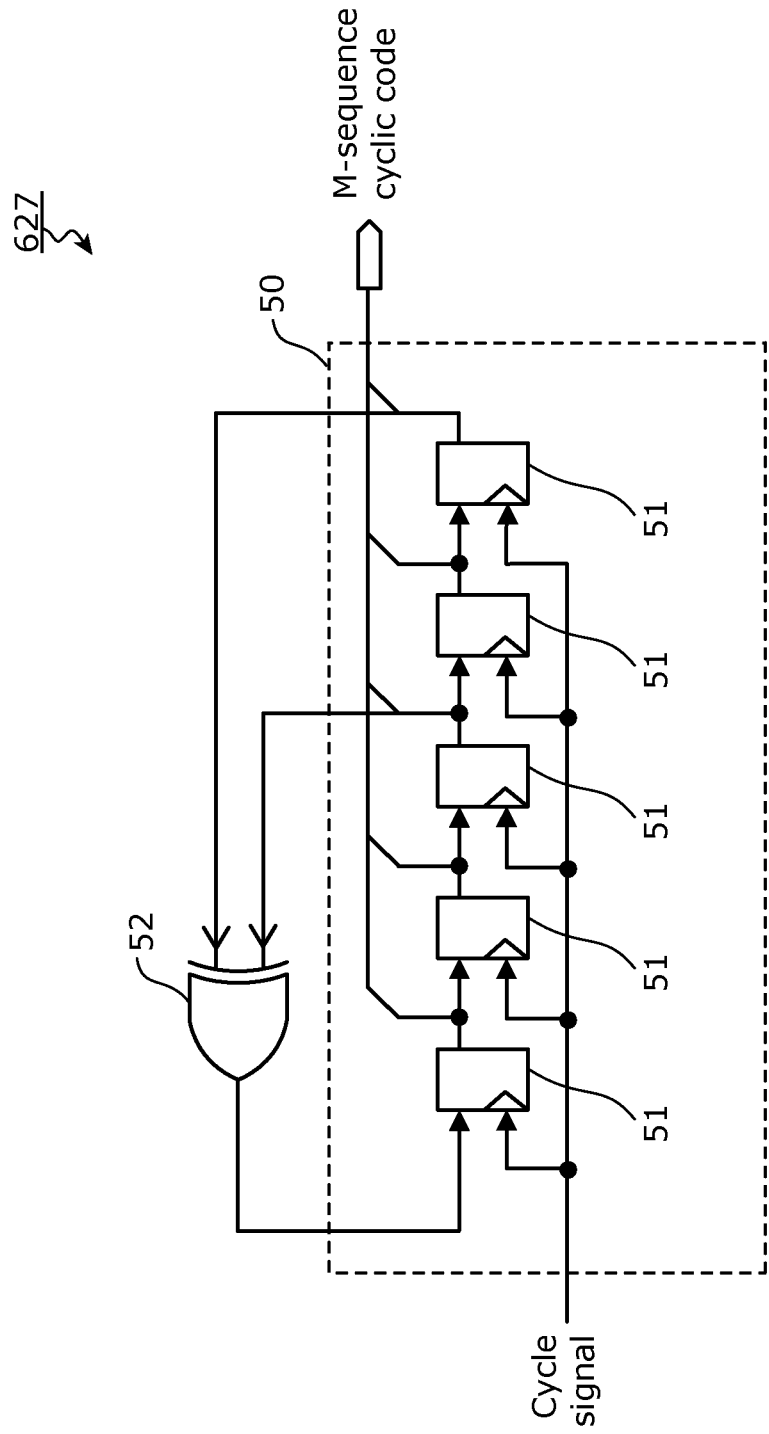
FIG. 15 is a block diagram illustrating an example configuration of an M-sequence cyclic code generating unit according to Embodiment 5.

FIG. 15 is a block diagram illustrating an example configuration of the M-sequence cyclic code generating unit 627 according to Embodiment 5.

With reference to FIG. 15, the M-sequence cyclic code generating unit 627 includes a shift register 50 and an exclusive OR (EXOR) circuit 52.

The shift register 50 includes five flip-flops 51. In other words, the shift register 50 includes the five-stage flip-flops 51. The M-sequence cyclic code generating unit 627 outputs each of output values of the five flip-flops 51 as a 5-bit M-sequence cyclic code.

Since operations performed by the M-sequence cyclic code generating unit 627 are the same as those performed by a general M-sequence cyclic code generating unit, the details will not be described.

Each time the M-sequence cyclic code generating unit 627 receives a cycle signal, it outputs, to the subtraction unit 628, an M-sequence cyclic code that is a random value. Specifically, each time the M-sequence cyclic code generating unit 627 receives a cycle signal, it randomly selects one of the values from "1" to "31" and outputs the selected value (M-sequence cyclic code).

Hereinafter, a period in which the M-sequence cyclic code generating unit 627 outputs all of the values from "1" to "31" will be referred to as a random value output period.

Each time the subtraction unit 628 receives an M-sequence cyclic code, it outputs, to the variable cycle counter 610C, a value obtained by subtracting 1 from the received M-sequence cyclic code as a cycle setting value to be counted by the variable cycle counter 610C.

Here, a period in which the variable cycle counter 610C ends counting once is a period in which values from 0 to the cycle setting value are counted. Here, assume that a period in which the refresh-rate requirements are satisfied is, for example, a period in which the variable cycle counter 610C counts 16 times. When the cycle setting value is 15, the variable cycle counter 610C counts 16 times.

As described above, the M-sequence cyclic code generating unit 627 randomly selects one of the values from "1" to "31" and outputs the selected value (M-sequence cyclic code). Thus, an average of 31 M-sequence cyclic codes output from the M-sequence cyclic code generating unit 627 is "16".

Accordingly, the average period can satisfy the refresh-rate requirements by setting a value obtained by subtracting "1" from the M-sequence cyclic code output by the M-sequence cyclic code generating unit 627 to a cycle setting value. In other words, the trigger generating unit 600D generates refresh triggers in a variable cycle to satisfy the refresh-rate requirements.

The configuration of the M-sequence cyclic code generating unit 627 is not limited to the one in FIG. 15. As long as the M-sequence cyclic code generating unit 627 outputs a random value, the configuration may be the other.

Figure 16:
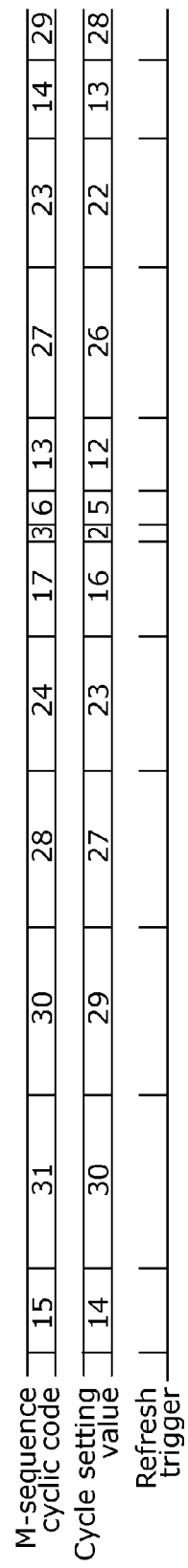
FIG. 16 is an example timing chart for describing operations of the trigger generating unit according to Embodiment 5.

FIG. 16 is an example timing chart for describing operations of the trigger generating unit 600D according to Embodiment 5. The horizontal axis in FIG. 16 represents time.

In FIG. 16, the "M-sequence cyclic code" means a value indicated by an M-sequence cyclic code at each timing.

The "Cycle setting value" is a cycle setting value at each timing.

In FIG. 16, one refresh trigger corresponds to one trigger (pulse).

The M-sequence cyclic code is updated in a range from "1" to "31" with respect to the average period of 16 (cycle setting value=15). Furthermore, the variable cycle counter 610C counts according to the cycle setting value obtained by subtracting "1" from the M-sequence cyclic code.

As illustrated in FIG. 16, as the cycle setting value is larger, the cycle of the refresh trigger is longer. In other words, the trigger generating unit 600D generates refresh triggers in a variable cycle. The trigger generating unit 600D transmits the refresh triggers in the variable cycle, to the refresh request unit 710.

Accordingly, the occurrence cycles of refresh requests satisfy the refresh-rate requirements, and cannot be constant. In other words, the trigger generating unit 600D generates refresh triggers in a variable cycle to satisfy the refresh-rate requirements.

Hereinafter, a signal generated by the trigger generating unit 600D according to Embodiment 5 and including refresh triggers in a variable cycle will be referred to as a variable cycle signal SA5.

The trigger generating unit 600D generates refresh triggers in a variable cycle. Thus, the refresh control device A5 including the trigger generating unit 600D according to Embodiment 5 can reduce the level of noise caused by the cycles of the refresh triggers included in the variable cycle signal SA5 more than the level of noise caused by the refresh triggers generated in a constant cycle. In other words, the refresh control device A5 can reduce the level of noise caused by the cycles of triggers for requesting refresh operations of a memory more than the level of noise caused by the triggers generated in a constant cycle.

The trigger generating unit 600D does not have to include the subtraction unit 628 depending on the configuration of the M-sequence cyclic code generating unit 627 or the range of values indicated by the M-sequence cyclic code. Here, each time the M-sequence cyclic code generating unit 627 receives a cycle signal, it outputs an M-sequence cyclic code to the variable cycle counter 610C as a cycle setting value.

In other words, each time the variable cycle counter 610C generates a trigger, the M-sequence cyclic code generating unit 627 outputs an M-sequence cyclic code of a different value to the variable cycle counter 610C as a cycle setting value to be counted by the variable cycle counter 610C.

The configuration of the trigger generating unit 600D is not limited to that for generating refresh triggers in a variable cycle. For example, the trigger generating unit 600D may have both functions of generating refresh triggers in a constant cycle and in a variable cycle.

Here, the refresh control device A5 according to Embodiment 5 has both of the functions of generating refresh triggers in a constant cycle and in a variable cycle.

In order for the trigger generating unit 600D to generate refresh triggers in a constant cycle, for example, the cycle setting value generating unit 620D sets the cycle setting value output by the cycle setting value generating unit 620D to a fixed value in response to an instruction from the external CPU 320.

Embodiment 6

Next, Embodiment 6 will be described with reference to the drawings.

Figure 17:
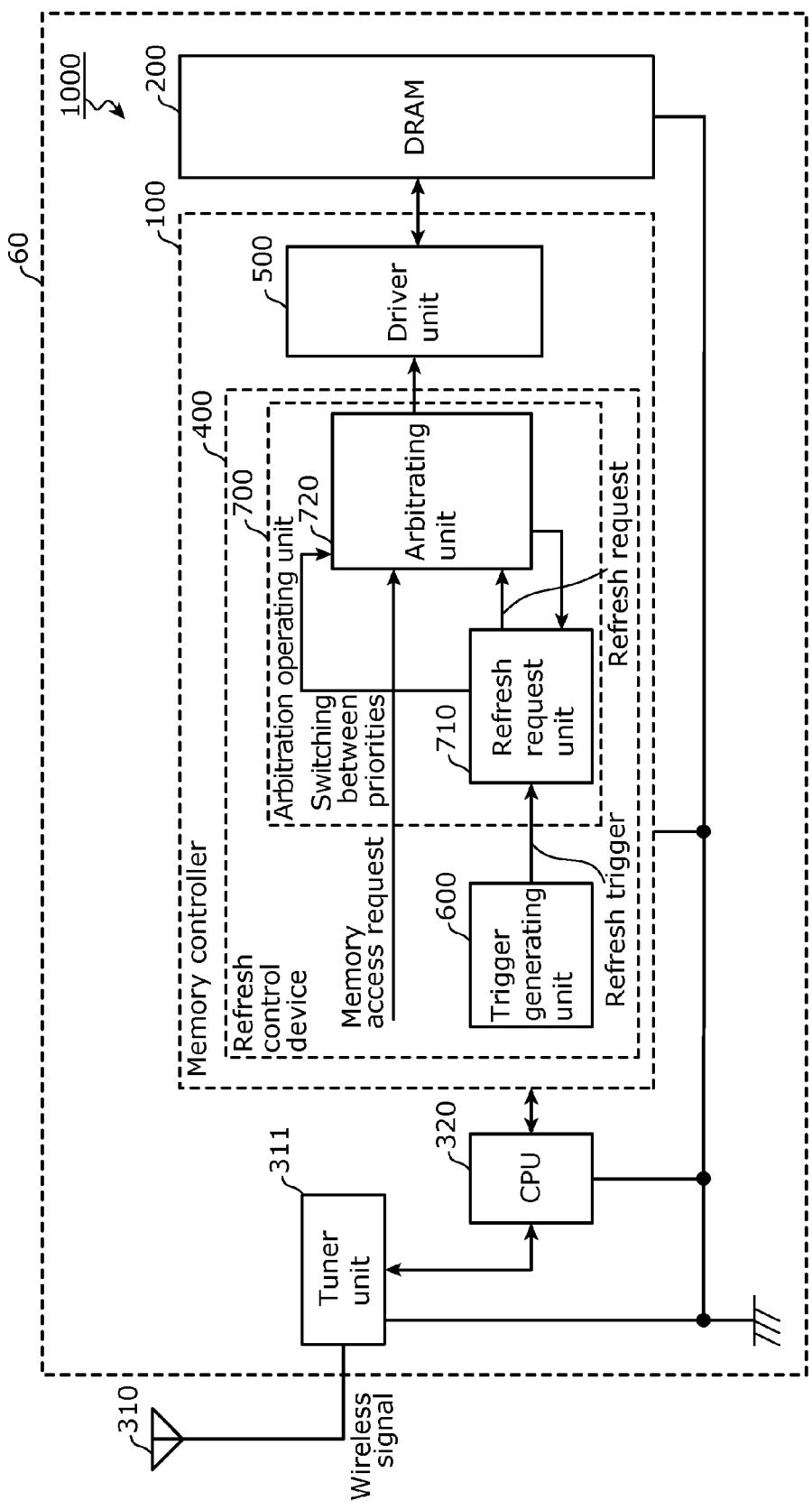
FIG. 17 is a block diagram illustrating a configuration of a wireless receiver according to Embodiment 6.

FIG. 17 is a block diagram illustrating a configuration of a wireless receiver 1000 according to Embodiment 6.

With reference to FIG. 17, the detailed description of the wireless receiver 1000 is the same as that of the wireless receiver 1000 in FIG. 1, and thus will not be repeated.

The constituent elements included in the wireless receiver 1000 are placed on a board 60. In other words, a tuner unit 311, a volatile memory (DRAM 200), and a refresh control device 400 are placed on the same board 60.

Hereinafter, the refresh control device that generates refresh triggers in a constant cycle will be referred to as a refresh control device J.

The trigger generating unit 600 generates refresh triggers in a variable cycle. Thus, it is possible to reduce a level of refresh noise occurring in refresh operations of the DRAM 200 more than that of refresh control device J that generates refresh triggers in a constant cycle. Thus, it is possible to prevent the tuner unit 311 from being directly influenced by the refresh noise.

Figure 19:
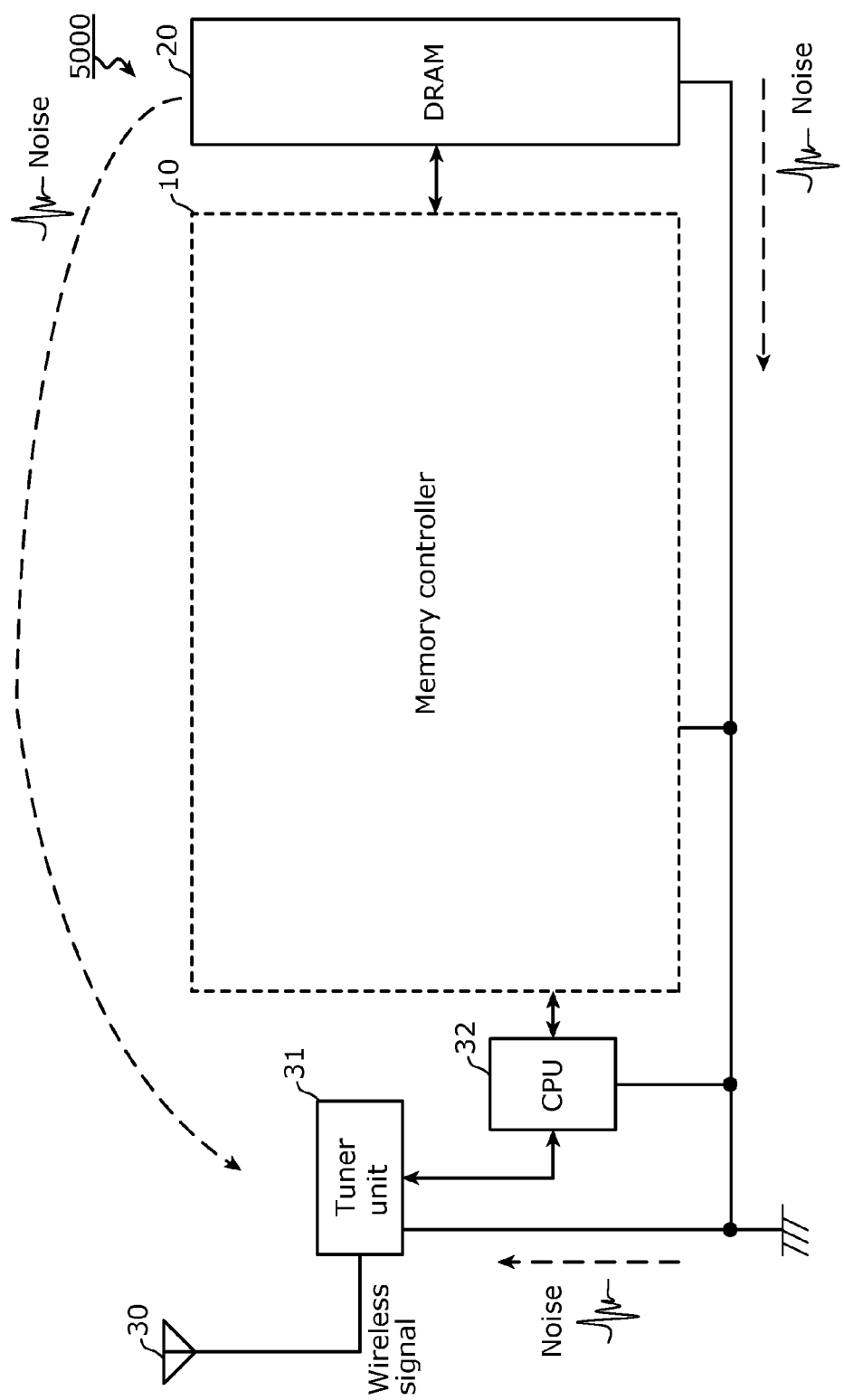
FIG. 19 is a block diagram illustrating a configuration of a general wireless receiver.
Figure 20:
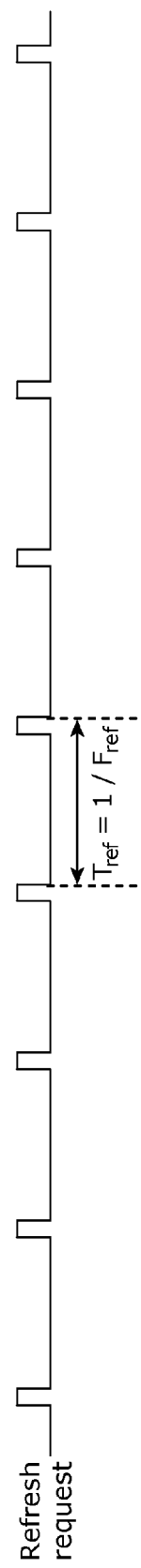
FIG. 20 is a waveform chart of refresh requests.
Figure 21:
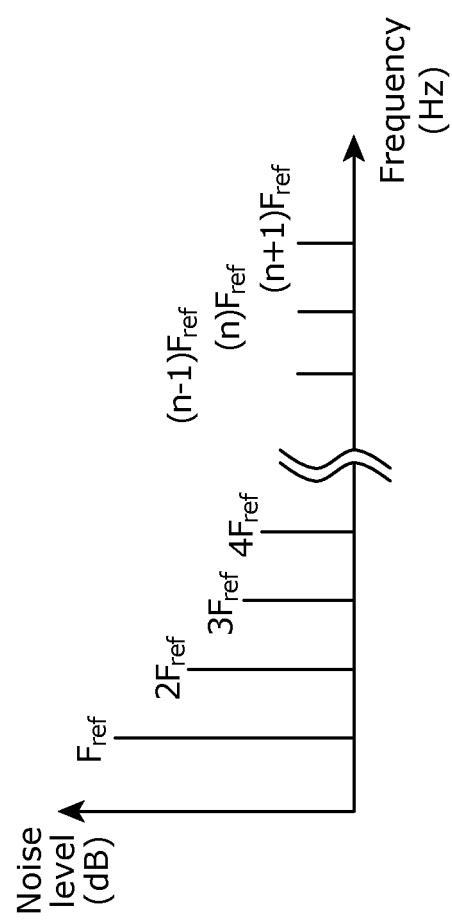
FIG. 21 shows a frequency spectrum of a signal.

Here, assume that a wireless receiver including the refresh control device J is, for example, the wireless receiver 5000 in FIG. 19. Furthermore, assume that the refresh control device J is included in the memory controller 10. The wireless receiver 5000 includes the refresh control device J that generates refresh triggers in a constant cycle.

Against refresh noise, the wireless receiver 5000 may have a configuration including a decoupling circuit between the tuner unit 31 and a GND line and a configuration in which the tuner unit 31 is shielded by an electromagnetic shield.

In other words, the wireless receiver 1000 does not have to include expensive noise suppression parts required by the wireless receiver 5000 against the refresh noise, such as the decoupling circuit and the electromagnetic shield.

Thus, the tuner unit 311 can be placed on a print board on which a DRAM and other digital circuits are placed. As a result, prices of wireless receivers can be reduced, and the wireless receivers can be miniaturized.

Instead of the refresh control device 400, one of the refresh control devices A2, A3, A4, and A5 may be placed on the board 60. In other words, the wireless receiver 1000 may include one of the refresh control devices A2, A3, A4, and A5 instead of the refresh control device 400.

Specifically, the wireless receiver 1000 according to Embodiment 6 includes a refresh control device, the tuner unit 311 that receives a wireless signal, and a volatile memory (DRAM 200) that holds data. The refresh control device generates, in a variable cycle, refresh triggers for requesting the volatile memory (DRAM 200) to perform a refresh operation.

Embodiment 7

Next, Embodiment 7 will be described with reference to the drawings.

Figure 18:
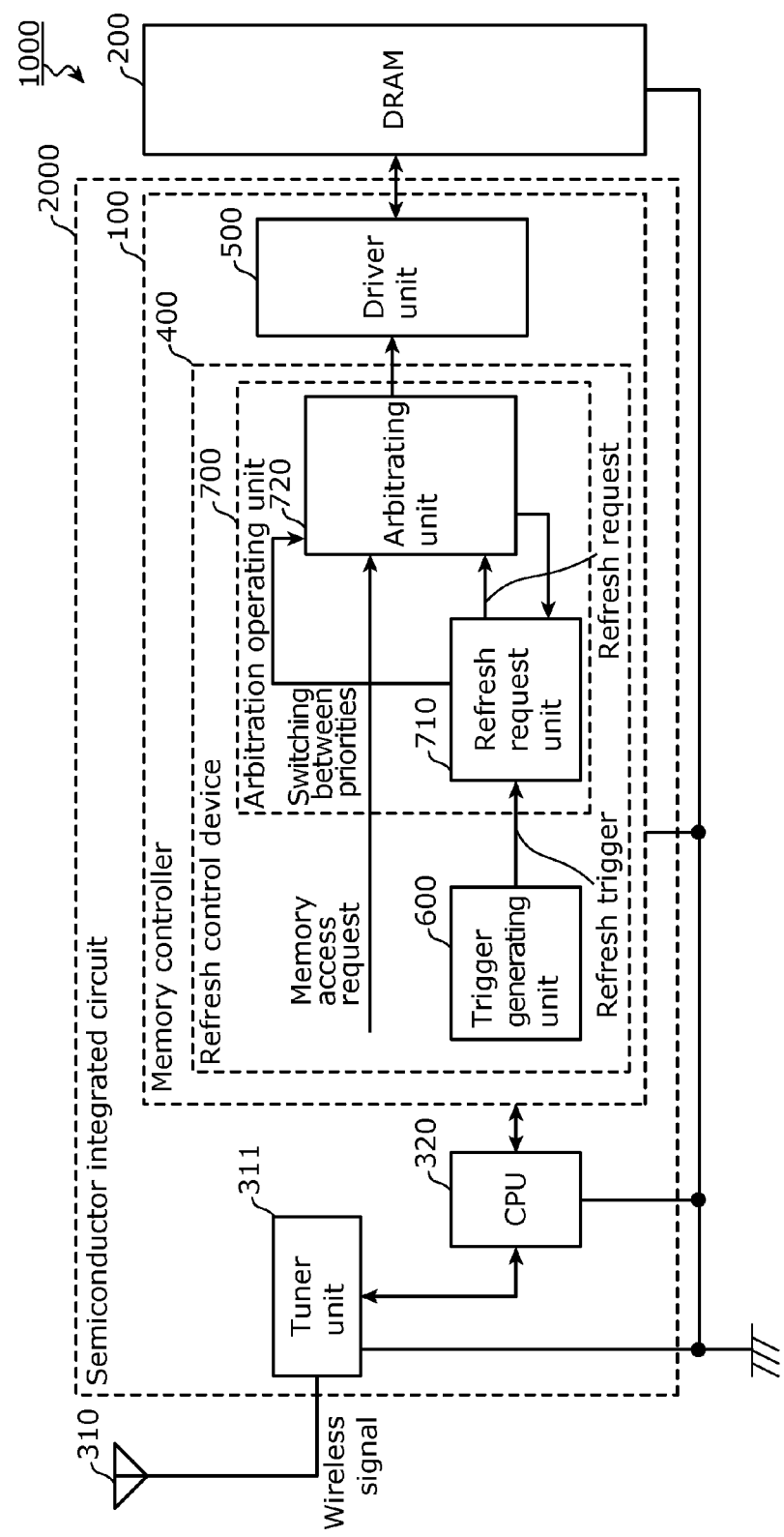
FIG. 18 illustrates a configuration of a semiconductor integrated circuit according to Embodiment 7.

FIG. 18 is a block diagram illustrating a configuration of a semiconductor integrated circuit 2000 according to Embodiment 7. FIG. 18 illustrates the wireless receiver 1000 in FIG. 1.

The detailed description of the wireless receiver 1000 in FIG. 18 is the same as that of the wireless receiver 1000 in FIG. 1, and thus will not be repeated.

The semiconductor integrated circuit 2000 includes the tuner unit 311, the CPU 320, and the memory controller 100 among the constituent elements included in the wireless receiver 1000.

The memory controller 100 includes the refresh control device 400.

In other words, the semiconductor integrated circuit 2000 includes the refresh control device 400 and the tuner unit 311 that receives a wireless signal.

In the recent CMOS technology, a tuner unit may be included in a semiconductor integrated circuit including a digital circuit, using a monolithic structure of the tuner unit and the digital circuit. Here, noise propagated through silicon and a semiconductor package may influence a reception state of wireless signals.

However, with inclusion of a trigger generating unit 600 that generates refresh triggers in a variable cycle instead of a trigger generating unit that generates refresh triggers in a constant cycle, the semiconductor integrated circuit 2000 can suppress the influence on the reception state of wireless signals. Accordingly, prices of semiconductor integrated circuits can be reduced, and the semiconductor integrated circuits can be miniaturized.

Instead of the refresh control device 400, one of the refresh control devices A2, A3, A4, and A5 may be placed in the semiconductor integrated circuit 2000.

In the semiconductor integrated circuit 2000, two of a semiconductor of the tuner unit and a semiconductor of the digital circuit may be included in the same semiconductor package with a multi-chip structure.

Furthermore, the semiconductor integrated circuit 2000 may include the DRAM 200 as well. With this configuration, prices of semiconductor integrated circuits can be reduced, and the semiconductor integrated circuits can be miniaturized.

Although the refresh control device according to the present disclosure are described based on Embodiments, the herein disclosed subject matter is to be considered descriptive and illustrative only, and the appended Claims are of a scope intended to cover and encompass not only the particular embodiments disclosed, but also equivalent structures, methods, and/or uses.

Part or all of the constituent elements included in the refresh control devices according to the present disclosure may be configured in hardware.

Embodiments disclosed herein are exemplifications in all the points, and should not be regarded as limitations. The scope of the present disclosure is indicated by Claims, and is intended to include all the modifications within Claims, meanings of Equivalents, and the scope thereof.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

One or more exemplary embodiments disclosed herein relate to a refresh control device that performs processing on a volatile memory that requires a refresh operation. In particular, the refresh control device is applicable to a product area of consumer-oriented audio devices and car audio devices including radio tuners because such wireless receivers each including the refresh control device prevent refresh noise from interfering with reception of wireless signals.

Furthermore, the refresh control device according to the present disclosure may be widely applicable to a product area having problems in, not limited to the reception of wireless signals, but influence of digital noise in analog circuits, and is expected to improve on the problems.

The invention claimed is:
1. A wireless receiver, comprising:
a refresh control device, including:
  a non-transitory memory storing a program; and
  a hardware processor that executes the program and causes the refresh control device to operate as:
  an arbitration operating unit that arbitrates (i) a memory access request for accessing a volatile memory that requires a refresh operation for holding data and (ii) a refresh trigger for requesting execution of the refresh operation; and
  a trigger generating unit that generates refresh triggers in a base cycle that satisfies refresh-rate requirements defining a number of refresh operations necessary to be executed per a predetermined period for the volatile memory to hold the data, wherein the refresh triggers in the base cycle are generated at intervals that are not constant;
a tuner unit that receives a wireless signal; and
the volatile memory for holding the data,
wherein the refresh control device generates, in a variable cycle, the refresh triggers for requesting the volatile memory to perform the refresh operation, and
a frequency at which the tuner unit receives the wireless signal is different from each frequency indicating the refresh triggers in the variable cycle.

2. The wireless receiver according to claim 1,
wherein the arbitration operating unit includes:
a refresh request unit that outputs a refresh request for requesting execution of the refresh operation, based on the refresh triggers generated by the trigger generating unit; and
an arbitration unit that arbitrates the memory access request and the refresh request output by the refresh request unit for the arbitration operating unit.

3. The wireless receiver according to claim 1,
wherein the trigger generating unit includes:
a base cycle counter that sequentially indicates values in a range from a first value to a second value in a base cycle that satisfies the refresh-rate requirements, the second value being larger than the first value and the base cycle counter being a counter that sequentially indicates the same range of values from the first value to the second value for each base cycle;
a comparative value generating unit that outputs, for each of the base cycles, one of the values from the first value to the second value as a comparative value, the comparative value output being a different value for each of the base cycles; and
a matching detection unit configured to detect a matching timing at which the value indicated by the base cycle counter and the comparative value output by the comparative value generating unit match, and generate the refresh triggers at the matching timing.

4. The wireless receiver according to claim 3,
wherein the comparative value generating unit includes:
a comparative value holding unit that holds the comparative value, and outputs the held comparative value;
an addition unit that performs addition processing, at each of the base cycles, for adding an additional value to the comparative value held by the comparative value holding unit to calculate a first calculated value; and
a limit processing unit that determines whether or not the first calculated value is larger than the second value, each time the addition unit performs the addition processing,
the limit processing unit:
performs limit processing for subtracting a difference between the first value and the second value from the first calculated value to calculate a second calculated value, and transmits the second calculated value to the comparative value holding unit as a latest comparative value, when the first calculated value is larger than the second value; and
transmits the first calculated value to the comparative value holding unit as a latest comparative value, when the first calculated value is smaller than or equal to the second value, and
the comparative value holding unit holds the latest comparative value transmitted from the limit processing unit instead of the held comparative value, at each of the base cycles.

5. The wireless receiver according to claim 3,
wherein the comparative value generating unit includes:
a comparative value holding unit that holds the comparative value, and outputs the held comparative value;
an additional value holding unit that holds an additional value and outputs a held latest additional value, at each of the base cycles;
an addition unit that performs addition processing for adding, at each of the base cycles, the latest additional value held by the additional value holding unit to the comparative value held by the comparative value holding unit to calculate a first calculated value;
a first determining unit that determines whether or not the first calculated value is larger than the second value, each time the addition unit performs the addition processing;
a second determining unit that determines whether or not the latest additional value output by the additional value holding unit is the first value or the second value; and
a computing unit that performs computation using the additional value, each time the additional value holding unit outputs the latest additional value,
the second determining unit further:
causes the computing unit to increment the additional value held by the additional value holding unit by 1 at each of the base cycles until the additional value becomes the second value and to transmit the latest additional value to the additional value holding unit each time the additional value is incremented by 1, when the additional value is the first value; and
causes the computing unit to decrement the additional value held by the additional value holding unit by 1 at each of the base cycles until the additional value becomes the first value and to transmit the latest additional value to the additional value holding unit each time the additional value is decremented by 1, when the additional value is the second value, and
the additional value holding unit holds the latest additional value transmitted from the computing unit instead of the held additional value, at each of the base cycles.

6. The wireless receiver according to claim 5,
wherein the first determining unit further:
performs limit processing for subtracting a difference between the first value and the second value from the first calculated value to calculate a second calculated value, and transmits the second calculated value to the comparative value holding unit as a latest comparative value, when the first calculated value is larger than the second value; and
transmits the first calculated value to the comparative value holding unit as a latest comparative value, when the first calculated value is smaller than or equal to the second value, and
the comparative value holding unit holds the latest comparative value transmitted from the first determining unit instead of the held comparative value, at each of the base cycles.

7. The wireless receiver according to claim 1,
wherein the trigger generating unit includes:
a reference counter that sequentially indicates values in a range from a first value to a third value in a division cycle that is M or more times as large as a base cycle that satisfies the refresh-rate requirements, the third value being larger than the first value, and M being an integer larger than or equal to 2, the reference counter sequentially indicating the same range of values from the first value to the third value for each division cycle; and
M matching detection units each hold one of the values from the first value to the third value as a comparative value,
the M comparative values held by the M matching detection units are different from each other,
the M matching detection units detect matching timings at each of which the value indicated by the reference counter and the comparative value held by the matching detection unit match, and generate triggers at the matching timings, and the trigger generating unit further includes a generating unit that generates the triggers by the M matching detection units as the refresh triggers at the matching timings that are different from each other.

8. The wireless receiver according to claim 1,
wherein the trigger generating unit includes:
a variable cycle counter that determines a timing for generating the refresh trigger, and generates a trigger each time counting of a variable cycle counter ends; and
a cycle setting value generating unit that outputs a different value to the variable cycle counter as the cycle setting value to be counted by the variable cycle counter, each time the variable cycle counter generates the trigger, and
the variable cycle counter generates the trigger generated each time the counting ends as the refresh trigger.

9. The wireless receiver according to claim 8,
wherein the cycle setting value output by the cycle setting value generating unit is one of values from a fourth value to a fifth value, the fifth value being larger than the fourth value,
the fourth value is a value obtained by subtracting 1/u of a predetermined value from the predetermined value, where u is an integer larger than or equal to 2, the predetermined value corresponding to a base cycle that satisfies the refresh-rate requirements,
the fifth value is a value obtained by adding the 1/u of the predetermined value to the predetermined value,
the cycle setting value generating unit includes:
a cycle setting value holding unit that holds the cycle setting value, and outputs a held latest cycle setting value at least to the variable cycle counter, each time the variable cycle counter generates the trigger;
a determining unit that determines whether or not the latest cycle setting value output by the cycle setting value holding unit is the fourth value or the fifth value; and
a computing unit that performs computation using the cycle setting value, each time the cycle setting value holding unit outputs the latest cycle setting value,
the determining unit further:
causes the computing unit to increment the cycle setting value held by the cycle setting value holding unit by 1 until the cycle setting value becomes the fifth value and to transmit the latest cycle setting value to the cycle setting value holding unit each time the cycle setting value is incremented by 1, when the cycle setting value is the fourth value; and
causes the computing unit to decrement the cycle setting value held by the cycle setting value holding unit by 1 until the cycle setting value becomes the fourth value and to transmit the latest cycle setting value to the cycle setting value holding unit each time the cycle setting value is decremented by 1, when the cycle setting value is the fifth value, and
the cycle setting value holding unit holds the latest cycle setting value transmitted from the computing unit instead of the held cycle setting value, each time the variable cycle counter generates the trigger.

10. The wireless receiver according to claim 8,
wherein the cycle setting value generating unit includes a code generating unit that outputs an M-sequence cyclic code of a different value to the variable cycle counter as the cycle setting value to be counted by the variable cycle counter, each time the variable cycle counter generates the trigger.

11. The wireless receiver according to claim 1,
wherein the refresh control device functions to generate the refresh triggers, both in a constant cycle and in a variable cycle.

12. The wireless receiver according to claim 1,
wherein the tuner unit, the volatile memory, and the refresh control device are placed on a same board.

13. A semiconductor integrated circuit, comprising:
the wireless receiver according to claim 1.

14. The wireless receiver according to claim 1,
wherein refresh trigger cycles in which the refresh triggers are generated include at least a cycle slower than the base cycle, and
an average value of refresh trigger cycles that satisfy the refresh-rate requirements is faster than or equal to the base cycle.

15. A refresh control device, comprising:
a non-transitory memory storing a program; and
a hardware processor that executes the program and causes the refresh control device to operate as:
an arbitration operating unit that arbitrates (i) a memory access request for accessing a volatile memory that requires a refresh operation for holding data and (ii) a refresh trigger for requesting execution of the refresh operation; and
a trigger generating unit that generates refresh triggers in a variable cycle to satisfy refresh-rate requirements defining a number of refresh operations necessary to be executed per a predetermined period for the volatile memory to hold the data,
wherein the trigger generating unit includes:
a base cycle counter that sequentially indicates values in a range from a first value to a second value in a base cycle that satisfies the refresh-rate requirements, the second value being larger than the first value and the base cycle counter being a counter that sequentially indicates the same range of values from the first value to the second value for each base cycle;
a comparative value generating unit that outputs, for each of the base cycles, one of the values from the first value to the second value as a comparative value, the comparative value output being a different value for each of the base cycles; and
a matching detection unit configured to detect a matching timing at which the value indicated by the base cycle counter and the comparative value output by the comparative value generating unit match, and generate the refresh triggers at the matching timing.

16. A refresh control device, comprising:
a non-transitory memory storing a program; and
a hardware processor that executes the program and causes the refresh control device to operate as:
an arbitration operating unit that arbitrates (i) a memory access request for accessing a volatile memory that requires a refresh operation for holding data and (ii) a refresh trigger for requesting execution of the refresh operation; and
a trigger generating unit that generates refresh triggers in a variable cycle to satisfy refresh-rate requirements defining a number of refresh operations necessary to be executed per a predetermined period for the volatile memory to hold the data, wherein the trigger generating unit includes:
a variable cycle counter that determines a timing for generating the refresh trigger, and generates a trigger each time counting of the variable cycle counter ends; and
a cycle setting value generating unit that outputs a different value to the variable cycle counter as the cycle setting value to be counted by the variable cycle counter, each time the variable cycle counter generates the trigger, and
the variable cycle counter generates the trigger generated each time the counting ends as the refresh trigger, and
wherein the cycle setting value output by the cycle setting value generating unit is one of values from a fourth value to a fifth value, the fifth value being larger than the fourth value,
the fourth value is a value obtained by subtracting 1/u of a predetermined value from the predetermined value, where u is an integer larger than or equal to 2, the predetermined value corresponding to a base cycle that satisfies the refresh-rate requirements,
the fifth value is a value obtained by adding the 1/u of the predetermined value to the predetermined value,
the cycle setting value generating unit includes:
a cycle setting value holding unit that holds the cycle setting value, and outputs a held latest cycle setting value at least to the variable cycle counter, each time the variable cycle counter generates the trigger;
a determining unit that determines whether or not the latest cycle setting value output by the cycle setting value holding unit is the fourth value or the fifth value; and
a computing unit that performs computation using the cycle setting value, each time the cycle setting value holding unit outputs the latest cycle setting value,
the determining unit further:
causes the computing unit to increment the cycle setting value held by the cycle setting value holding unit by 1 until the cycle setting value becomes the fifth value and to transmit the latest cycle setting value to the cycle setting value holding unit each time the cycle setting value is incremented by 1, when the cycle setting value is the fourth value; and
causes the computing unit to decrement the cycle setting value held by the cycle setting value holding unit by 1 until the cycle setting value becomes the fourth value and to transmit the latest cycle setting value to the cycle setting value holding unit each time the cycle setting value is decremented by 1, when the cycle setting value is the fifth value, and
the cycle setting value holding unit holds the latest cycle setting value transmitted from the computing unit instead of the held cycle setting value, each time the variable cycle counter generates the trigger.

17. A wireless receiver, comprising:
a refresh control device, including:
a non-transitory memory storing a program, and
a hardware processor that executes the program and causes the refresh control device to operate as:
an arbitration operating unit that arbitrates (i) a memory access request for accessing a volatile memory that requires a refresh operation for holding data and (ii) a refresh trigger for requesting execution of the refresh operation, and
a trigger generating unit that generates refresh triggers in a variable cycle at intervals that are not constant to satisfy refresh-rate requirements defining a number of refresh operations necessary to be executed per a predetermined period for the volatile memory to hold the data;
a tuner unit that receives a wireless signal; and
the volatile memory for holding the data,
wherein the refresh control device generates, in the variable cycle, the refresh triggers for requesting the volatile memory to perform the refresh operation, and
a frequency at which the tuner unit receives the wireless signal is different from each frequency indicating the refresh triggers in the variable cycle.

18. A wireless receiver, comprising:
a refresh control device, including:
a non-transitory memory storing a program; and
a hardware processor that executes the program and causes the refresh control device to operate as:
an arbitration operating unit that arbitrates (i) a memory access request for accessing a volatile memory that requires a refresh operation for holding data and (ii) a refresh trigger for requesting execution of the refresh operation; and
a trigger generating unit that spreads refresh frequencies and generates refresh triggers at intervals that are not constant in a base cycle that satisfies refresh-rate requirements defining a number of refresh operations necessary to be executed per a predetermined period for the volatile memory to hold the data;
a tuner unit that receives a wireless signal; and
the volatile memory for holding the data,
wherein the refresh control device generates, in a variable cycle, the refresh triggers for requesting the volatile memory to perform the refresh operation, and
a frequency at which the tuner unit receives the wireless signal is different from each frequency indicating the refresh triggers in the variable cycle.

* * * * *

UNITED STATES PATENT AND TRADEMARK OFFICE
CERTIFICATE OF CORRECTION

PATENT NO. : 9,824,741 B2  
APPLICATION NO. : 13/803304  
DATED : November 21, 2017  
INVENTOR(S) : Shiro Shimizu Page 1 of 1

It is certified that error appears in the above-identified patent and that said Letters Patent is hereby corrected as shown below:

On the Title Page

In item (73) "Assignee: PANASONIC INTELLECTUAL PROPERTY MANAGMENT CO., LTD., Osaka (JP)" should read -- PANASONIC INTELLECTUAL PROPERTY MANAGEMENT CO., LTD., Osaka (JP) --.

Signed and Sealed this  
Sixth Day of February, 2018

Joseph Matal  
*Performing the Functions and Duties of the*  
*Under Secretary of Commerce for Intellectual Property and*  
*Director of the United States Patent and Trademark Office*